United States Patent
Li et al.

(10) Patent No.: US 10,014,649 B2
(45) Date of Patent: Jul. 3, 2018

(54) STABILIZED NON-RECIPROCAL FIBER-RING BRILLOUIN LASER SOURCE

(71) Applicants: CALIFORNIA INSTITUTE OF TECHNOLOGY, Pasadena, CA (US); HQPHOTONICS INC., Pasadena, CA (US)

(72) Inventors: Jiang Li, Pasadena, CA (US); Kerry Vahala, Pasadena, CA (US)

(73) Assignees: CALIFORNIA INSTITUTE OF TECHNOLOGY, Pasadena, CA (US); HQPHOTONICS INC., Pasadena, CA (US)

( * ) Notice: Subject to any disclaimer, the term of this patent is extended or adjusted under 35 U.S.C. 154(b) by 0 days.

(21) Appl. No.: 15/387,089

(22) Filed: Dec. 21, 2016

(65) Prior Publication Data
US 2017/0302048 A1   Oct. 19, 2017

Related U.S. Application Data

(60) Provisional application No. 62/270,756, filed on Dec. 22, 2015.

(51) Int. Cl.
*H01S 3/067* (2006.01)
*H01S 3/11* (2006.01)
(Continued)

(52) U.S. Cl.
CPC ...... *H01S 3/06791* (2013.01); *H01S 3/06708* (2013.01); *H01S 3/094049* (2013.01);
(Continued)

(58) Field of Classification Search
None
See application file for complete search history.

(56) References Cited

U.S. PATENT DOCUMENTS

| 7,272,160 B1 * | 9/2007 | Geng | ...................... H01S 3/302 372/29.011 |
| 2004/0264977 A1 | 12/2004 | Yap et al. | |

(Continued)

FOREIGN PATENT DOCUMENTS

| JP | 2014-534639 A | 12/2014 |
| WO | 2014-155400 A2 | 10/2014 |

OTHER PUBLICATIONS

International Search Report and Written Opinion for International Application No. PCT/US2016/067987 filed Dec. 21, 2016 on behalf of Jiang Li, dated Mar. 17, 2017 10 pages.

*Primary Examiner* — Tod T Van Roy
(74) *Attorney, Agent, or Firm* — Steinfl + Bruno LLP; David S Alavi

(57) ABSTRACT

A stabilized laser source includes a fiber-ring Brillouin laser that incorporates a circulator for non-reciprocal operation and for launching of a pump optical signal. Most of the pump optical signal is launched in a forward direction and drives Brillouin laser oscillation in the backward direction, a portion of which exits via an optical coupler as the optical output of the laser source. A small fraction of the pump optical signal is launched in the backward direction via the optical coupler, and a fraction of that backward-propagating pump optical signal exits via the optical coupler as an optical feedback signal. A frequency-locking mechanism receives the optical feedback signal and controls the pump optical frequency to maintain resonant propagation of the backward-propagating pump optical signal. A second pump optical signal can be launched in the forward direction to generate a second Brillouin laser oscillation.

38 Claims, 12 Drawing Sheets

(51) Int. Cl.
 *H01S 3/30* (2006.01)
 *H01S 3/094* (2006.01)
 *H01S 3/13* (2006.01)
 *H01S 3/108* (2006.01)
 *H03B 17/00* (2006.01)

(52) U.S. Cl.
 CPC ...... *H01S 3/094096* (2013.01); *H01S 3/1086* (2013.01); *H01S 3/1109* (2013.01); *H01S 3/1305* (2013.01); *H01S 3/302* (2013.01); *H03B 17/00* (2013.01)

(56) References Cited

U.S. PATENT DOCUMENTS

| | | |
|---|---|---|
| 2010/0296528 A1 | 11/2010 | Haering et al. |
| 2014/0269789 A1 | 9/2014 | Westbrook et al. |
| 2014/0320863 A1 | 10/2014 | Christensen et al. |
| 2015/0236789 A1* | 8/2015 | Vahala ............ H03L 7/08 398/192 |
| 2015/0288135 A1* | 10/2015 | Qiu ............ H01S 3/1304 372/28 |
| 2015/0311662 A1 | 10/2015 | Vahala et al. |

* cited by examiner

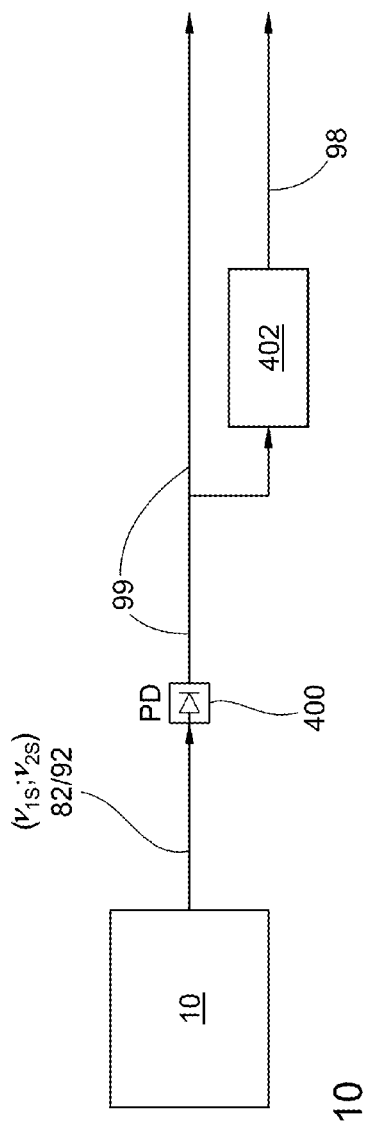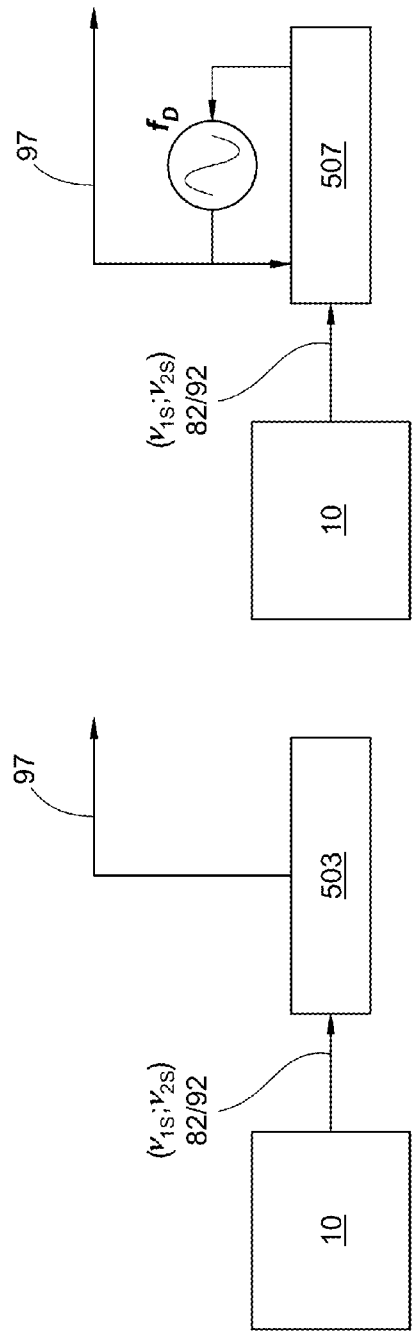

STABILIZED NON-RECIPROCAL FIBER-RING BRILLOUIN LASER SOURCE

BENEFIT CLAIM

This application claims benefit of U.S. provisional App. No. 62/270,756 filed Dec. 22, 2015 in the names of Jiang Li and Kerry Vahala, said provisional application being hereby incorporated by reference as if fully set forth herein.

STATEMENT REGARDING FEDERALLY SPONSORED RESEARCH

This invention was made with Government support under Contract Nos. W31P4Q-14-1-0001 and W911QX-13-C-0140 awarded by the U.S. Army Contracting Command. The Government has certain rights in the invention.

FIELD OF THE INVENTION

The field of the present invention relates to stabilized laser sources. In particular, one or more examples of a stabilized non-reciprocal fiber-ring Brillouin laser source, and methods of their use, are disclosed herein.

BACKGROUND

Examples of laser sources or methods of their use are disclosed in:

Stokes, L. F., M. Chodorow, and H. J. Shaw; "All-fiber stimulated Brillouin ring laser with submilliwatt pump threshold"; Optics Letters Vol 7 No 10 pp 509-511 (1982);

Smith, S. P., F. Zarinetchi, and S. Ezekiel; "Narrow-linewidth stimulated Brillouin fiber laser and applications"; Optics letters Vol 16 No 6 pp 393-395 (1991);

Geng, Jihong, et al; "Highly stable low-noise Brillouin fiber laser with ultranarrow spectral linewidth"; IEEE Photonics Technology Letters Vol 18 No 17 pp 1813-1815 (2006);

Lee, H., Chen, T., Li, J., Yang, K. Y., Jeon, S., Painter, O., and Vahala, K. J.; "Chemically etched ultrahigh-Q wedge-resonator on a silicon chip"; Nature Photonics Vol 6 pp 369-373 (2012);

Li, J., Lee, H., Chen, T., and Vahala, K. J.; "Characterization of a high coherence, Brillouin microcavity laser on silicon"; Optics Express Vol 20 pp 20170-20180 (2012);

Pant, Ravi, et al; "On-chip stimulated Brillouin scattering"; Optics Express Vol 19 No 9 pp 8285-8290 (2011);

Geng, J., Staines, S., and Jiang, S.; "Dual-frequency Brillouin fiber laser for optical generation of tunable low-noise radio frequency/microwave frequency"; Optics Letters Vol 33 pp 16-18 (2008);

Gross, M. C., Callahan, P. T., Clark, T. R., Novak, D., Waterhouse, R. B., and Dennis, M. L.; "Tunable millimeter-wave frequency synthesis up to 100 GHz by dual-wavelength Brillouin fiber laser"; Optics Express Vol 18 pp 13321-13330 (2010);

Callahan, P. T., Gross, M. C., and Dennis, M. L.; "Frequency-independent phase noise in a dual-wavelength Brillouin fiber laser"; IEEE J. Quantum Electronics Vol 47 pp 1142-1150 (2011);

J. Li, H. Lee, K. Vahala; "Microwave synthesizer using an on-chip Brillouin oscillator"; Nature Communications Vol 4 p 2097 (2013);

Li, J., Yi, X., Lee, H., Diddams, S. A., Vahala, K. J.; "Electro-optical frequency division and stable microwave synthesis"; Science Vol 345 Issue 6194 pp 309-313 (2014);

Liu, Jinmei, et al; "Optical generation of tunable microwave signal using cascaded Brillouin fiber lasers"; IEEE Photonics Technology Letters Vol 24 No 1 pp 22-24 (2012);

Wang, Gaomeng, et al; "Watt-level ultrahigh-optical signal-to-noise ratio single-longitudinal-mode tunable Brillouin fiber laser"; Optics Letters Vol 38 No 1 pp 19-21 (2013);

Drever, R., Hall, J. L., Kowalski, F., Hough, J., Ford, G., Munley, A., and Ward, H.; "Laser phase and frequency stabilization using an optical resonator"; Applied Physics B Vol 31 pp 97-105 (1983);

T. W. Hänsch and B. Couillaud; "Laser frequency stabilization by polarization spectroscopy of a reflecting reference cavity"; Optics Communications Vol 35 No 3 p 441 (1980);

Ferre-Pikal, E. S., Walls, F. L.; "Microwave regenerative frequency dividers with low phase noise"; IEEE Transactions on Ultrasonics, Ferro-electrics, and Frequency Control Vol 46 No 1 pp 216-219, (1999);

Fortier, T., Kirchner, M., Quinlan, F., Taylor, J., Bergquist, J., Rosenband, T., Lemke, N., Ludlow, A., Jiang, Y., Oates, C., et al; "Generation of ultrastable microwaves via optical frequency division"; Nature Photonics Vol 5 pp 425-429 (2011);

Swann, W. C., Baumann, E., Giorgetta, F. R., and Newbury, N. R.; "Microwave generation with low residual phase noise from a femtosecond fiber laser with an intracavity electro-optic modulator"; Optics Express Vol 19 pp 24387-24395 (2011);

H. Murata, A. Morimoto, T. Kobayashi, and S. Yamamoto; IEEE J. Sel. Top. Quantum Electron. 6, 1325 (2000);

A. J. Metcalf, V. Torres-Company, D. E. Leaird, and A. M. Weiner; "High-Power Broadly Tunable Electrooptic Frequency Comb Generator"; IEEE J. Sel. Top. Quantum Electronics Vol 19 p 3500306 (2013);

U.S. Pat. No. 9,450,673 entitled "Stabilized microwave-frequency source" issued Sep. 20, 2016 to Vahala, Diddams, Li, Yi, and Lee;

U.S. Pub. No. 2015/0236789 entitled "Dual-frequency optical source" published Aug. 20, 2015 in the names of Vahala and Li;

U.S. Pub. No. 2015/0311662 entitled "Stable microwave-frequency source based on cascaded Brillouin lasers" published Oct. 29, 2015 in the names of Li and Vahala; and U.S. Pub. No. 2016/0254646 entitled "Optical frequency divider based on an electro-optical-modulator frequency comb" published Sep. 1, 2016 in the names of Li and Vahala.

Each reference, patent, and publication listed above is incorporated by reference as if fully set forth herein.

SUMMARY

A laser source comprises a fiber-ring optical resonator, a pump laser source, and a frequency-locking mechanism. The fiber-ring optical resonator includes an optical circulator and an optical coupler, and is characterized by a Brillouin shift frequency $v_B$. The optical circulator is arranged so as to (i) limit to a single round trip propagation of an optical signal around the fiber-ring optical resonator in a forward direction, and (ii) permit resonant propagation of an optical signal around the fiber-ring optical resonator in a backward direction. The pump laser source produces a pump optical signal at a pump optical frequency $v_1$, and (i) launches into the fiber-ring optical resonator via the optical circulator a first input portion of the pump optical signal to propagate in the forward direction, and (ii) launches into the fiber-ring optical resonator via the optical coupler a second input portion of the pump optical signal to propagate in the backward direction. The frequency-locking mechanism couples the pump laser source and the fiber-ring optical resonator by controlling the pump optical frequency $v_1$ to maintain resonant propagation of the second input portion of the pump optical signal around the fiber-ring optical resonator in the backward direction. The fiber-ring optical resonator is arranged so as to produce from the first input portion of the pump optical signal a Brillouin laser optical signal, at a Brillouin laser frequency $v_{1S} = v_1 - v_B$, that resonantly propagates around the fiber-ring optical resonator in the backward direction. The optical coupler directs out of the fiber-ring optical resonator (i) an output portion of the second input portion of the pump optical signal, at the pump optical frequency $v_1$, to act as an optical feedback signal to the frequency-locking mechanism, and (ii) an output portion of the Brillouin laser optical signal, at the Brillouin laser frequency $v_{1S}$, to act as optical output of the laser source.

The laser source can further include a second pump laser source that produces a second pump optical signal at a second pump optical frequency $v_2$, and launches into the fiber-ring optical resonator via the optical circulator a first input portion of the second pump optical signal to propagate in the forward direction. The fiber-ring optical resonator is arranged so as to produce from the first input portion of the second pump optical signal a second Brillouin laser optical signal, at a second Brillouin laser frequency $v_{2S} = v_2 - v_B$, that resonantly propagates around the fiber-ring optical resonator in the backward direction. The optical coupler is arranged so as to direct out of the fiber-ring optical resonator an output portion of the second Brillouin laser optical signal, at the second Brillouin laser frequency $v_{2S}$, to act as second optical output of the laser source. A second input portion of the pump optical signal can be launched into the fiber-ring optical resonator via the optical coupler to propagate in the backward direction, and a second frequency-locking mechanism can couple the second pump laser source and the fiber-ring optical resonator by controlling the second pump optical frequency $v_2$ to maintain resonant propagation of the second input portion of the second pump optical signal around the fiber-ring optical resonator in the backward direction.

The optical output signals at the optical output frequencies $v_{1S}$ and $v_{2S}$ can be employed to generate an output electrical signal at an optical difference frequency $|v_{1S} - v_{2S}|$ by directing the optical output signals onto a photodetector; the output electrical signal exhibits reduced phase noise. An electrical frequency divider can be employed to divide the optical difference frequency $|v_{1S} - v_{2S}|$ of the output electrical signal to achieve still further phase noise reduction.

An optical or electro-optical frequency divider can be employed to generate, from the optical output signals at the optical output frequencies $v_{1S}$ and $v_{2S}$, an output electrical signal at a frequency $f_D$. The integer N that is closest to $|v_{1S} - v_{2S}|/f_D$ is the nominal frequency division ratio of the optical or electro-optical frequency divider. The output electrical signal at the frequency $f_D$ exhibits phase noise reduced by about a factor of $N^2$ relative to phase noise of the optical difference frequency $|v_{1S} - v_{2S}|$.

Objects and advantages pertaining to stabilized laser sources may become apparent upon referring to the example embodiments illustrated in the drawings and disclosed in the following written description or appended claims, and shall fall within the scope of the present disclosure or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 10 illustrates schematically generation of an electrical signal at an output optical difference frequency $|v_{1S} - v_{2S}|$.

FIG. 12A illustrates schematically generation of an electrical signal at an electrical output frequency $f_D$ by optical frequency division of an output optical difference frequency $|v_{1S} - v_{2S}|$. FIG. 12B illustrates schematically generation of an electrical signal at an electrical output frequency $f_D$ by electro-optical frequency division of an output optical difference frequency $|v_{1S} - v_{2S}|$.

The embodiments depicted are shown only schematically: all features may not be shown in full detail or in proper proportion, certain features or structures may be exaggerated relative to others for clarity, and the drawings should not be regarded as being to scale. The embodiments shown are only examples: they should not be construed as limiting the scope of the present disclosure or appended claims.

DETAILED DESCRIPTION OF EMBODIMENTS

Figure 1:
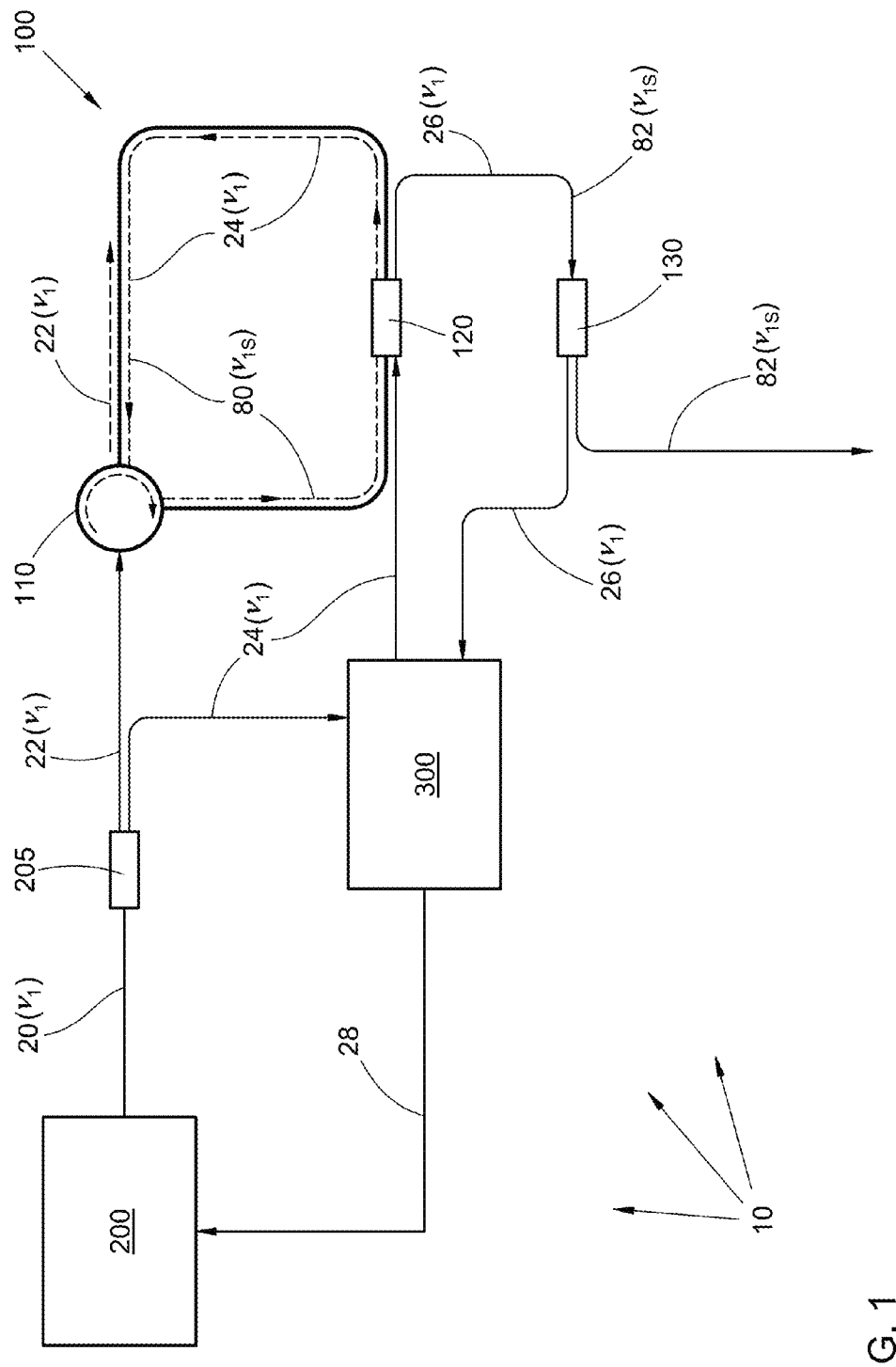
FIG. 1 illustrates schematically an example of an inventive laser source including a non-reciprocal fiber-ring cavity arranged to produce optical output at an output optical frequency $v_{1S}$.

An example of an inventive laser source 10 is illustrated schematically in FIG. 1 and comprises a fiber-ring optical resonator 100, a pump laser source 200, and a frequency-locking mechanism 300. The fiber-ring optical resonator 100 includes an optical circulator 110 and an optical coupler 120. The optical circulator 110 is arranged so as to (i) limit to a single round trip propagation of an optical signal around the fiber-ring optical resonator 100 in a forward direction (clockwise in the drawings), and (ii) permit resonant propagation of an optical signal around the fiber-ring optical resonator 100 in a backward direction (counterclockwise in the drawings).

The pump laser source 200 produces a pump optical signal 20 characterized by a pump optical frequency $v_1$. A first input portion 22 of the pump optical signal 20 is launched into the fiber-ring optical resonator 100, via the optical circulator 110, to propagate in the forward direction; that first portion 22 of the pump optical signal 20 makes only a single round trip around the fiber-ring optical resonator 100 before being rejected by the circulator 110. A second input portion 24 of the pump optical signal 20 is launched into the fiber-ring optical resonator 100, via the optical coupler 120, to propagate in the backward direction; that second portion 24 of the pump optical signal 20 makes multiple round trips around the fiber-ring optical resonator 100 through the circulator 110. The frequency-locking mechanism 300 couples the pump laser source 200 and the fiber-ring optical resonator 100 by controlling the pump optical frequency $v_1$ (via an electrical laser-control signal 28) to maintain resonant propagation of the second input portion 24 of the pump optical signal 20 around the fiber-ring optical resonator 100 in the backward direction. The optical coupler 120 directs out of the fiber-ring optical resonator 100 an output portion 26 of the second input portion 24 of the pump optical signal 20, at the pump optical frequency $v_1$; at least a portion of the optical signal 26 acts as an optical feedback signal to the frequency-locking mechanism 300.

The fiber-ring optical resonator 100 is characterized by a Brillouin shift frequency $v_B$ (that varies proportionally with the pump optical frequency $v_1$), and produces from the first input portion 22 of the pump optical signal 20 a Brillouin laser optical signal 80 at a Brillouin laser frequency $v_{1S}=v_1-v_B$. The backward-propagating Brillouin laser optical signal 80 is at least partly transmitted by the optical circulator 100 upon each round trip around the fiber-ring resonator 100, and so can resonantly propagate around the fiber-ring optical resonator 100 in the backward direction (i.e., counterpropagating with respect to the first input portion 22 of the pump laser signal 20). The optical coupler 120 directs out of the fiber-ring optical resonator 100 an output portion 82 of the Brillouin laser optical signal 80 at the Brillouin laser frequency $v_{1S}$; at least a portion of the optical signal 82 acts as optical output of the laser source 10. In some examples, the optical coupler 120 is a 95/5 coupler (i.e., about 5% of the power circulating in the fiber-ring resonator 100 exits on each round trip); other suitable coupling ratios can be employed.

In some examples, the pump optical frequency $v_1$ is between about 75 THz and about 750 THz (i.e., the pump wavelength in vacuum is between about 400 nm and about 4 μm); in some examples, the pump optical frequency $v_1$ is between about 120 THz and about 430 THz (i.e., the pump wavelength in vacuum is between about 700 nm and about 2.5 μm); in some examples, the pump optical frequency $v_1$ is between about 150 THz and about 300 THz (i.e., the pump wavelength in vacuum is between about 1 μm and about 2 μm). Any suitable pump laser source can be employed (e.g., a semiconductor, solid state, fiber, or dye laser), either directly or after any suitable frequency shifting (e.g., via phase modulation, one or more nonlinear optical processes, and so forth) or after any suitable amplification (e.g., using a semiconductor, solid state, fiber, or dye amplifier). In some examples a fiber laser operating at about 1550 nm is employed, amplified by a fiber amplifier. The fiber-ring optical resonator 100 typically comprises silica optical fiber that is characterized by a Brillouin shift frequency $v_B$ of about 10.9 GHz when pumped at about 1550 nm. Other suitable optical fiber material(s) can be employed, and those other fiber materials can exhibit other corresponding Brillouin shift frequencies. The optical circulator 110 and the optical coupler 120 can be of any suitable type or construction. In some examples, the optical coupler 120 can be a fused-fiber coupler.

The presence of the optical circulator 110 in the fiber-ring resonator 100 causes the resonator 100 to exhibit non-reciprocal behavior (e.g., unidirectional resonant propagation in the backward direction versus only a single round trip in the forward direction). In a bidirectional resonator (e.g., a fiber-ring resonator that does not include an optical circulator, or a microdisk resonator), intracavity power buildup in the reverse direction (relative the pump signal propagation), and output power at the Brillouin laser frequency ($v_{1S}=v_1-v_B$), are limited by onset of resonant oscillation in the forward direction at another Brillouin laser frequency $v_1-2v_B$ (pumped by intracavity power at the Brillouin laser frequency $v_{1S}=v_1-v_B$). Multiple cascaded orders of Brillouin laser oscillation, propagating around the resonator in alternating directions and spaced by the Brillouin shift frequency $v_B$, can occur simultaneously in a single bidirectional resonator pumped by a single pump signal. In contrast, in the non-reciprocal fiber-ring resonator 100 (non-reciprocal due to the presence of the optical circulator 110 incorporated into the resonator 100), resonant propagation in the forward direction is prevented, so that no higher orders of Brillouin laser oscillation can occur. This non-reciprocal behavior of the fiber-ring resonator 100 has the effect of enabling higher buildup of intracavity power of the Brillouin laser signal 80 and higher output power at the Brillouin laser wavelength $v_{1S}=v_1-v_B$. That increase in laser power can be desirable in its own right, and can also be desirable because Schawlow-Townes noise in a Brillouin laser oscillator typically is inversely proportional to its output power. The disclosed non-reciprocal arrangement of the fiber-ring resonator 100, that suppresses higher-order Brillouin laser oscillation and therefore enables higher output power at the Brillouin laser wavelength $v_{1S}=v_1-v_B$, results in lower Schawlow-Townes noise in the Brillouin laser output 82 than would be achievable otherwise.

In some examples, the threshold for Brillouin laser oscillation is on the order of a few tens of milliwatts of power in the pump optical signal, and about a hundred milliwatts of pump optical power yields about 10 milliwatts of corresponding Brillouin laser output power. Other thresholds or conversion efficiencies can be achieved or employed.

Schawlow-Townes noise of the Brillouin laser signal 80 and optical output 82 also is inversely related to the spatial volume of the resonant optical mode of the Brillouin laser signal 80 supported by the fiber-ring optical resonator 100. A longer fiber-ring resonator 100 therefore produces Brillouin laser output that exhibits correspondingly less Schawlow-Townes noise than the Brillouin laser output of a shorter but otherwise equivalent fiber-ring resonator. In some examples, the fiber-ring optical resonator 100 includes an optical fiber greater than or equal to about 10 meters long, with a corresponding free spectral range less than about 20 MHz; in some examples, the fiber-ring optical resonator 100 includes an optical fiber greater than or equal to about 40 meters long, with a corresponding free spectral range less than about 5 MHz; in some examples, the fiber-ring optical resonator 100 includes an optical fiber greater than or equal to about 100 meters long, with a corresponding free spectral range less than about 2 MHz; in some examples, the fiber-ring optical resonator 100 includes an optical fiber greater than or equal to about 200 meters long, with a corresponding free spectral range less than about 1 MHz; in some examples, the fiber-ring optical resonator 100 includes an optical fiber greater than or equal to about 500 meters long, with a corresponding free spectral range less than about 0.4 MHz.

Silica optical fiber typically is employed in the fiber-ring resonator 100, and exhibits stimulated Brillouin gain with a bandwidth of about 50 MHz. A fiber-ring resonator 100 with a free spectral range less than 50 MHz, including those described above, typically can produce Brillouin laser output (at the Brillouin laser frequency $v_{1S}=v_1-v_B$) without requiring a frequency-locking mechanism, because at least one resonant mode of the fiber-ring cavity will sufficiently overlap the stimulated Brillouin gain spectral profile at the Brillouin-shifted pump optical frequency $v_1-v_B$. The stimulated Brillouin gain spectral profile varies sufficiently rapidly near its peak so that typically only one resonant mode at a time supports resonant Brillouin laser oscillation. However, in response to fluctuations or drift of the pump optical frequency $v_1$, the resonant Brillouin laser signal typically will intermittently hop from one resonant mode of the fiber-ring resonator 100 to another, which is undesirable if the laser source 10 is to be used as or incorporated into a stable frequency reference.

Figure 4:
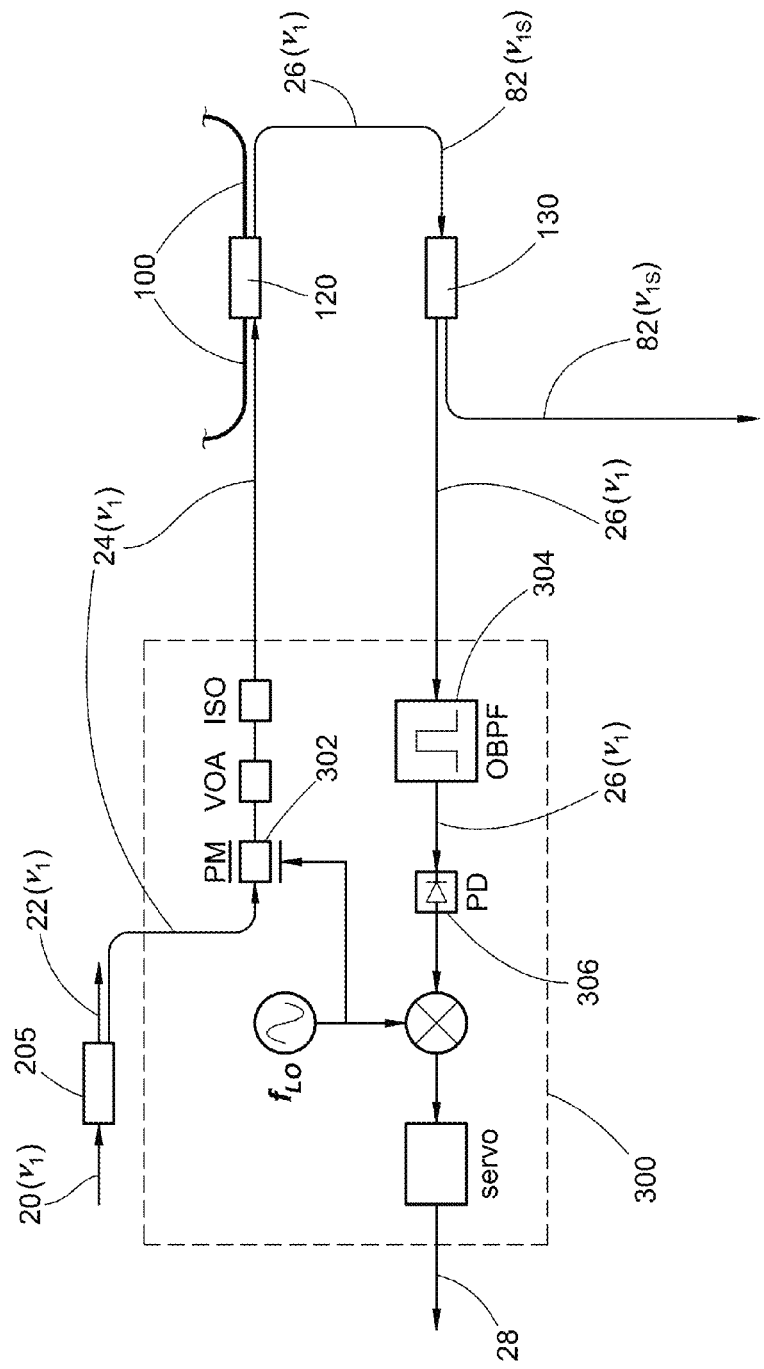
FIG. 4 illustrates schematically an example of a single frequency-locking mechanism. PM: phase modulator; VOA: variable optical attenuator; ISO: optical isolator; OBPF: optical bandpass filter; PD: photodiode; servo: electronic servo mechanism.

The frequency-locking mechanism 300 substantially prevents such mode-hopping of the Brillouin laser oscillation 80 in the fiber-ring resonator 100. Any suitable frequency-locking mechanism can be employed. In some examples, the frequency-locking mechanism 300 includes a Pound-Drever-Hall mechanism (e.g., as in FIGS. 4 and 9); in some examples, the frequency-locking mechanism includes a Hänsch-Couillaud mechanism; other suitable mechanisms can be employed. A common feature of some examples of the frequency-locking mechanism 300 is the need for a portion of the pump optical signal 20 to undergo resonant propagation around the fiber-ring optical resonator 100 in a resonant mode thereof. The first input portion 22 of the pump optical signal 20, which propagates in the forward direction and drives generation of the Brillouin laser signal 80, cannot undergo such resonant propagation around the fiber-ring resonator 100, because it is rejected by the optical circulator 110 after a single round trip. An inventive feature of the laser sources disclosed herein is the launching of the second input portion 24 of the pump optical signal 20 into the fiber-ring resonator 100 to propagate in the backward direction. In the backward direction, the input portion 24 of the pump optical signal 20 is at least partly transmitted by the optical circulator 110 and so can undergo resonant propagation around the fiber-ring resonator 100. An optical splitter 205 can be employed to split off a small fraction (e.g., a few percent) of the pump optical signal 20 to be launched into the fiber-ring optical resonator 100 as the second input portion 24. The fraction of the pump optical signal 20 that is diverted into the second input portion 24 is kept relatively low so as to leave a larger fraction for the first input portion 22 (to drive generation of the Brillouin laser signal 80), to reduce optical loss of the second input portion 24 in the fiber-ring optical resonator 100 due to Brillouin scattering, or for both reasons. Brillouin laser generation driven by the second input portion 24 is not an issue, however, because such laser oscillation would be in the forward direction (i.e., counterpropagating relative to the backward-propagating second input portion 24), and is therefore suppressed by the optical circulator 110.

In the examples shown, the second input portion 24 of the pump optical signal 20 is launched into the fiber-ring optical resonator 100 by the optical coupler 120 (which acts as an output coupler and directs the output portion 82 of the Brillouin laser signal 80 out of the fiber-ring resonator 100), and the optical coupler 120 also directs an output portion 26 of the backward-propagating signal 24 out of the fiber-ring resonator 100; in other examples, an optical coupler separate from the optical coupler 120 can be employed for launching the second input portion 24 into the fiber-ring resonator or to direct the output portion 26 out of the fiber-ring resonator 100. In the examples shown, an optical splitter 130 can be employed to divide the optical signals directed out of the fiber-ring resonator 100 by the coupler 120 (i.e., optical signals 26 and 82); one fraction propagates to the frequency-locking mechanism 300, while the other fraction propagates along the optical output path of the laser source 10. The fraction of the output portion 26 of the resonantly propagating input portion 24, at the pump optical frequency $v_1$, that is directed by the splitter 130 to the frequency-locking mechanism 300 acts as an optical feedback signal to the frequency-locking mechanism 300.

In some examples (e.g., wherein a Pound-Drever-Hall frequency locking mechanism 300 is employed), the second input portion 24 of the pump optical signal 20 is directed through a portion of the frequency-locking mechanism 300 on its way to being launched into the fiber-ring optical resonator 100. In the specific example of a Pound-Drever-Hall mechanism 300 (e.g., as in FIG. 4), the second input portion 24 passes through a phase modulator 302 driven at a local oscillator frequency $f_{LO}$. A fraction of the output portion 26 of the resonantly propagating input portion 24 of the pump optical signal 20 is directed onto a photodetector 306 (typically after passing through an optical bandpass filter 304 that separates the output portion 26 at the optical frequency $v_1$ from other optical frequencies present, such as the Brillouin laser frequency $v_{1S}=v_1-v_B$). Any suitable optical bandpass filter can be employed (e.g., an optical wave shaper such as a Finisar Waveshaper 1000/SP, a Fabry-Perot type filter, or a fiber Bragg grating in reflection mode). The modulator drive signal (at the local oscillator frequency $f_{LO}$) and the signal from the photodetector 306 are employed in any suitable way (e.g., using a mixer, comparator, loop-filter, or other servo components, mechanisms, or circuitry) to generate an electrical laser-control signal 28 that is applied to the pump laser source 200 to control the pump optical frequency $v_1$. In some other examples using some other types of frequency-locking mechanism 300, the second output portion 24 of the pump optical signal 20 propagates directly to the optical coupler 120, without passing through any portion of the frequency-locking mechanism 300.

In a silica fiber-ring resonator 100 that is about 10 meters long or longer (i.e., with a free spectral range less than about 20 MHz), the frequency-locking mechanism serves to ensure resonant oscillation of the Brillouin laser signal 80, and also to prevent mode-hopping and to reduce phase noise of the optical output 82 of the laser source 10. In a shorter fiber-ring resonator 100, however, wherein the free spectral range is larger than the stimulated Brillouin gain bandwidth, the frequency-locking mechanism 300 is also used to ensure that the Brillouin laser frequency $v_{1S}=v_1-v_B$ substantially coincides with a resonant mode of the fiber-ring resonator 100. This can be accomplished in some examples by (i) arranging the fiber-ring resonator 100 so that an integer multiple of its free spectral range is about equal to its Brillouin shift frequency $v_B$ (e.g., about 10.9 GHz in silica fiber pumped at 1550 nm), and then (ii) using the frequency-locking mechanism 300 to lock the pump optical frequency $v_1$ to a resonant mode of the fiber-ring resonator 100.

Figure 2:
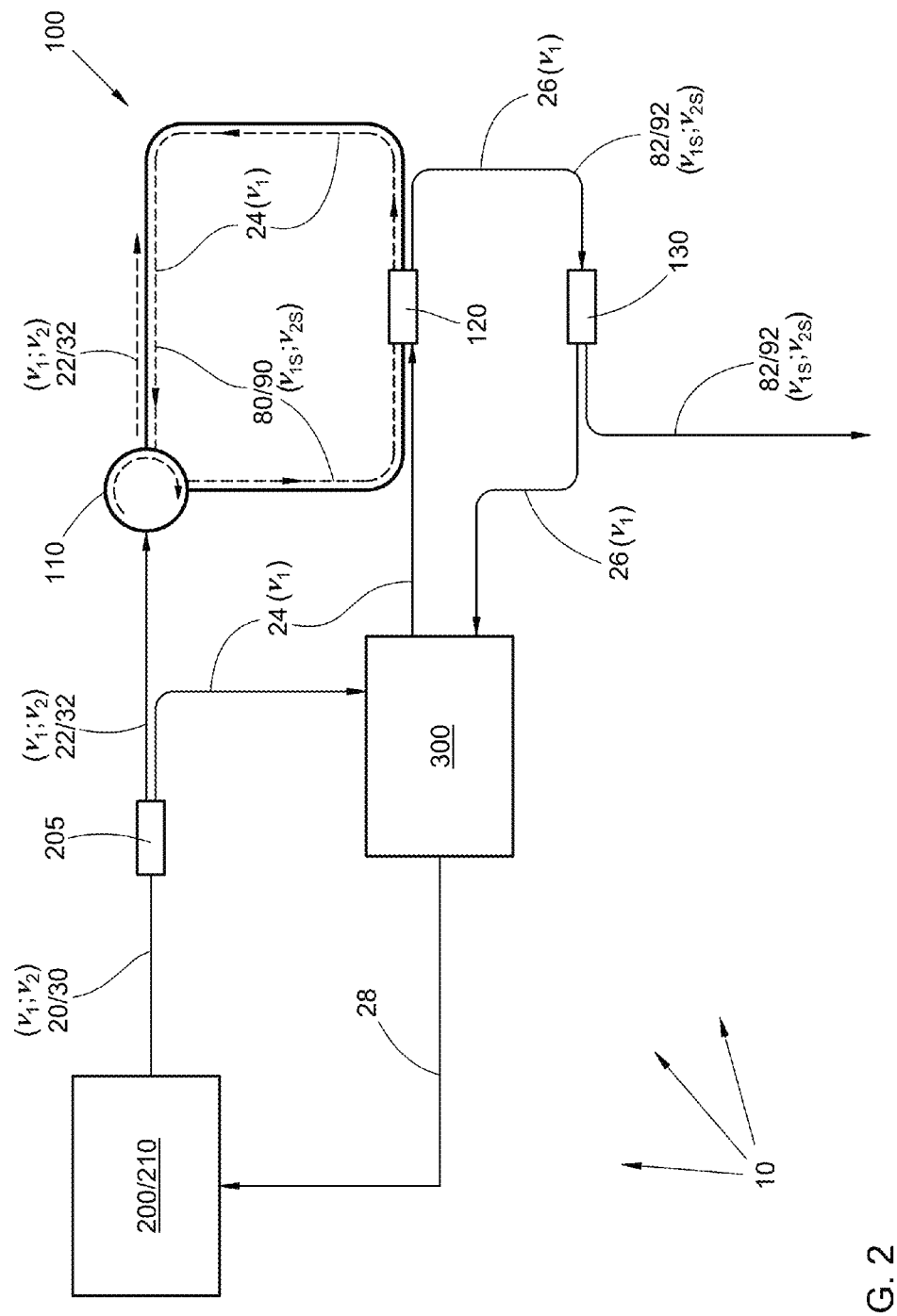
FIG. 2 illustrates schematically an example of an inventive laser source including a non-reciprocal fiber-ring cavity arranged to produce optical output at output optical frequencies $v_{1S}$ and $v_{2S}$.
Figure 3:
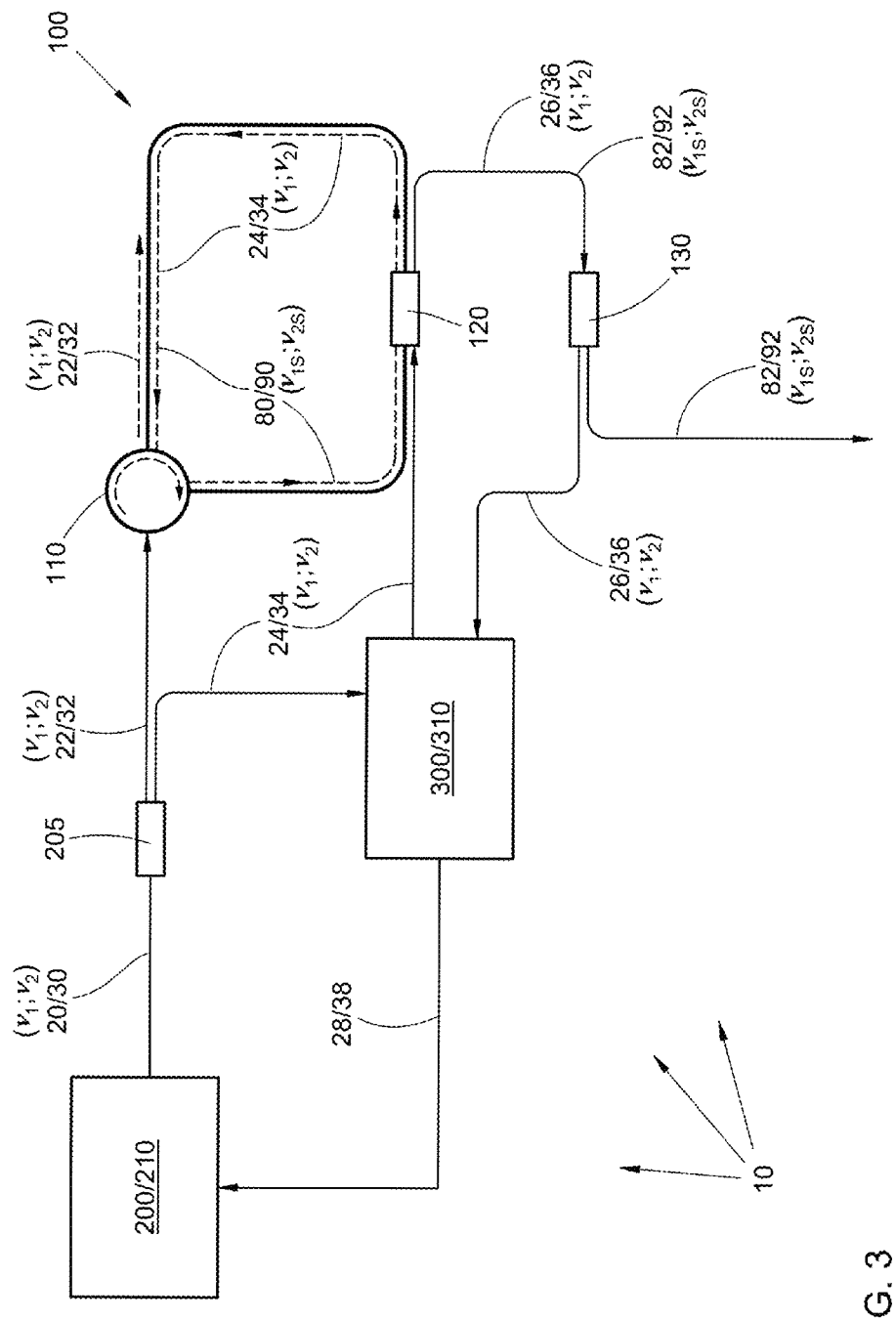
FIG. 3 illustrates schematically an example of an inventive laser source including a non-reciprocal fiber-ring cavity arranged to produce optical output at output optical frequencies $v_{1S}$ and $v_{2S}$.

FIGS. 2 and 3 illustrate schematically examples of an inventive laser source that further include a second pump laser source 210 that produces a second pump optical signal 30 at a second pump optical frequency $v_2$. A first input portion 32 of the second pump optical signal 30 is launched into the fiber-ring optical resonator 100 via the optical circulator 110 to propagate in the forward direction, where it makes only a single round trip before being rejected by the optical circulator 110. The fiber-ring optical resonator 100 produces from the first input portion 32 of the second pump optical signal 30 a second Brillouin laser optical signal 90 at a Brillouin laser frequency $v_{2S}=v_2-v_B$. The second Brillouin laser optical signal 90 resonantly propagates around the fiber-ring optical resonator 100 in the backward direction (i.e., counterpropagating with respect to the first input portion 32 of the second pump laser signal 30), and is at least partly transmitted by the optical circulator 100 upon each round trip around the fiber-ring resonator 100. The optical coupler 120 directs out of the fiber-ring optical resonator 100 an output portion 92 of the second Brillouin laser optical signal 90, at the second Brillouin laser frequency $v_{2S}$; at least a portion of the optical signal 92 acts as second optical output of the laser source 10. The second pump frequency $v_2$ can be in the same ranges as those given above for the pump frequency $v_1$.

Figure 5:
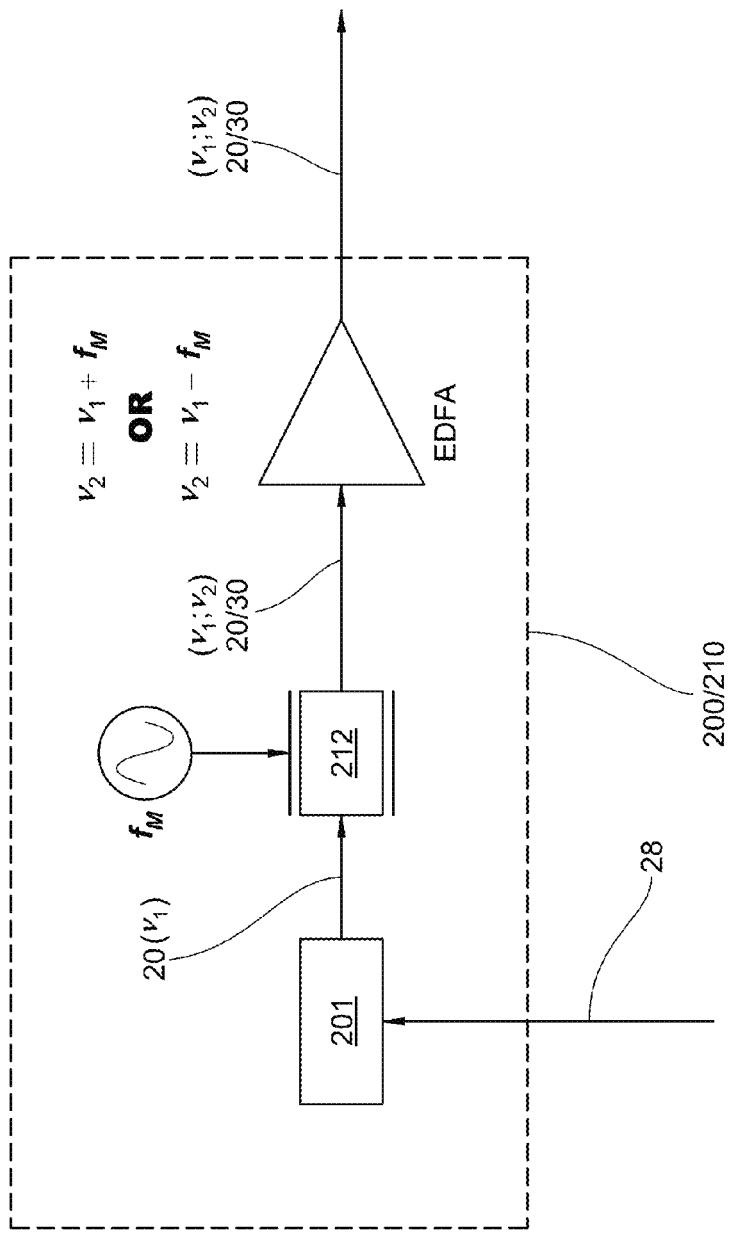
FIG. 5 illustrates schematically an example of pump laser sources arranged to produce a pump optical signals at pump optical frequencies $v_1$ and $v_2$. EDFA: erbium-doped fiber amplifier.

The second pump laser source 210 can be provided in a variety of ways. In the example illustrated schematically in FIG. 5, the pump laser source 200 is a single pump laser 201 operated at the pump optical frequency $v_1$, and the second pump laser source 210 includes at least one phase modulator 212 operated at a frequency $f_M$. The phase modulator 212 generates, from at least a portion of the pump optical signal 20 at the pump optical frequency $v_1$, the second pump optical signal 30 at the second pump optical frequency $v_2$. The second pump optical frequency is either $v_2=v_1+f_M$ or $v_2=v_1-f_M$, as needed, desirable, or convenient (i.e., either one or the other of the immediately adjacent sidebands generated by the phase modulator 212). In the example shown the pump optical signal 20 and the second pump optical signal 30 are amplified using a fiber-amplifier (EDFA). The pump optical signal 20 and the second pump optical signal 30 co-propagate away from the phase modulator 212, so no additional coupler or beamsplitter is needed to launch them both through the amplifier (if present) or through the optical circulator 110 and into the fiber-ring optical resonator 100. The first pump optical frequency $v_1$ is locked to the fiber-ring optical resonator 100 using the frequency-locking mechanism 300 to control the pump laser 201 (as described above). Frequency fluctuations and phase noise on the modulator drive signal at the frequency $f_M$ typically are sufficiently small so that a separate frequency-locking mechanism for the second pump optical signal 30 is not needed (i.e., the pump laser sources 200/210 of FIG. 5 are suitable for use in the arrangement of FIG. 2). Frequency fluctuations and phase noise of the second optical output 92 are similar to those of the optical output 82, at least partly because they are generated in the same fiber-ring optical resonator 100.

Figure 6:
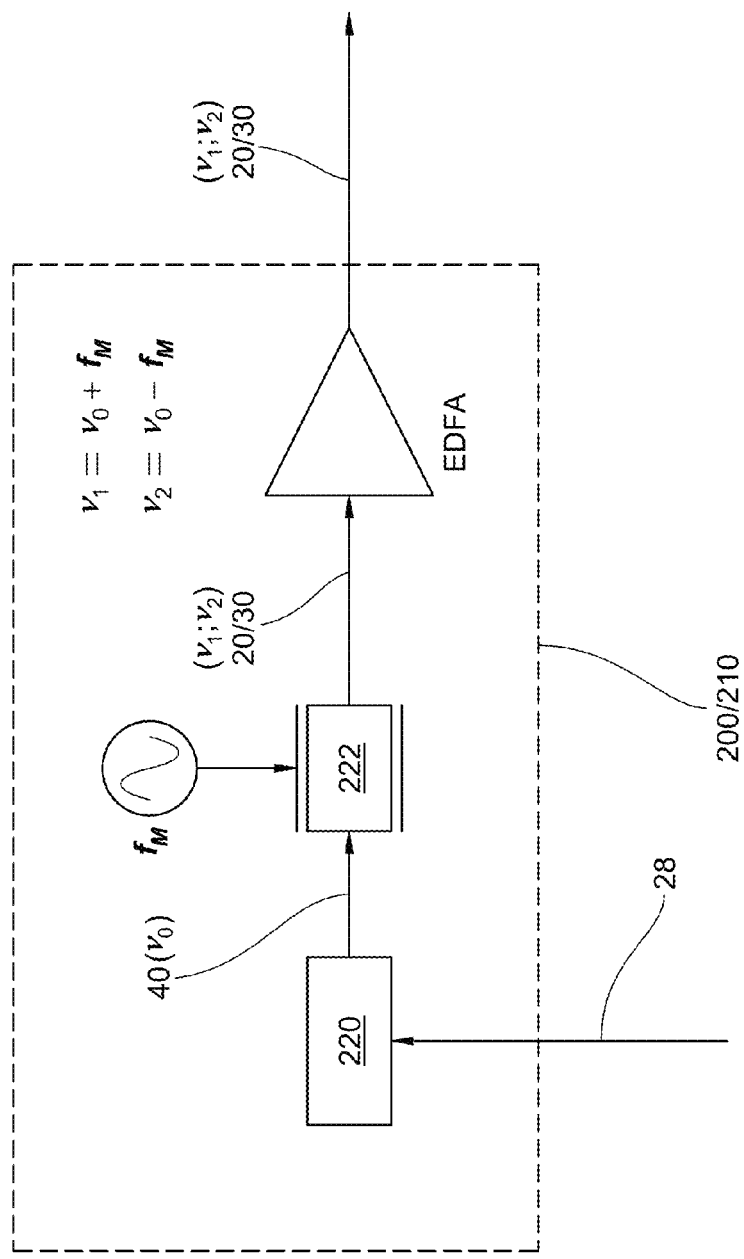
FIG. 6 illustrates schematically an example of pump laser sources arranged to produce a pump optical signals at pump optical frequencies $v_1$ and $v_2$.

In the example illustrated schematically in FIG. 6, the pump laser source 200 and the second pump laser source 210 include a single pump laser 220, operated at an optical frequency $v_0$, and at least one phase modulator 222, operated at a frequency $f_M$. The phase modulator 222 generates, from the optical output 40 of the pump laser 220 at the optical frequency $v_0$, the pump optical signal 20 and the second pump optical signal 30. The corresponding pump optical frequencies $v_1$ and $v_2$ are either (i) $v_1=v_0-f_M$ and $v_2=v_0+f_M$, or (ii) (as shown in FIG. 6) $v_1=v_0+f_M$ and $v_2=v_0-f_M$; in either case, the pump optical signals 20 and 30 are the two immediately adjacent sidebands generated by the phase modulator 222. As in the previous example, a fiber amplifier is employed to amplify the two pump optical signals 20/30. Also as in the previous example, the pump optical signal 20 and the second pump optical signal 30 co-propagate away from the phase modulator 222, so no additional coupler or beamsplitter is needed to launch them both through the optical circulator 110 into the fiber-ring optical resonator 100. The first pump optical frequency $v_1$ is locked to the fiber-ring optical resonator 100 using the frequency-locking mechanism 300 to control the optical frequency $v_0$ of the pump laser 220 while holding $f_M$ constant. Frequency fluctuations and phase noise on the modulator drive signal at the frequency $f_M$ typically are sufficiently small so that, as in the previous example, a separate frequency-locking mechanism for the second pump optical signal 30 typically is not needed (i.e., the pump laser sources 200/210 of FIG. 6 are suitable for use in the arrangement of FIG. 2). Frequency fluctuations and phase noise of the second optical output 92 nearly match those of the optical output 82, at least partly because they are generated in the same fiber-ring optical resonator 100.

Figure 7:
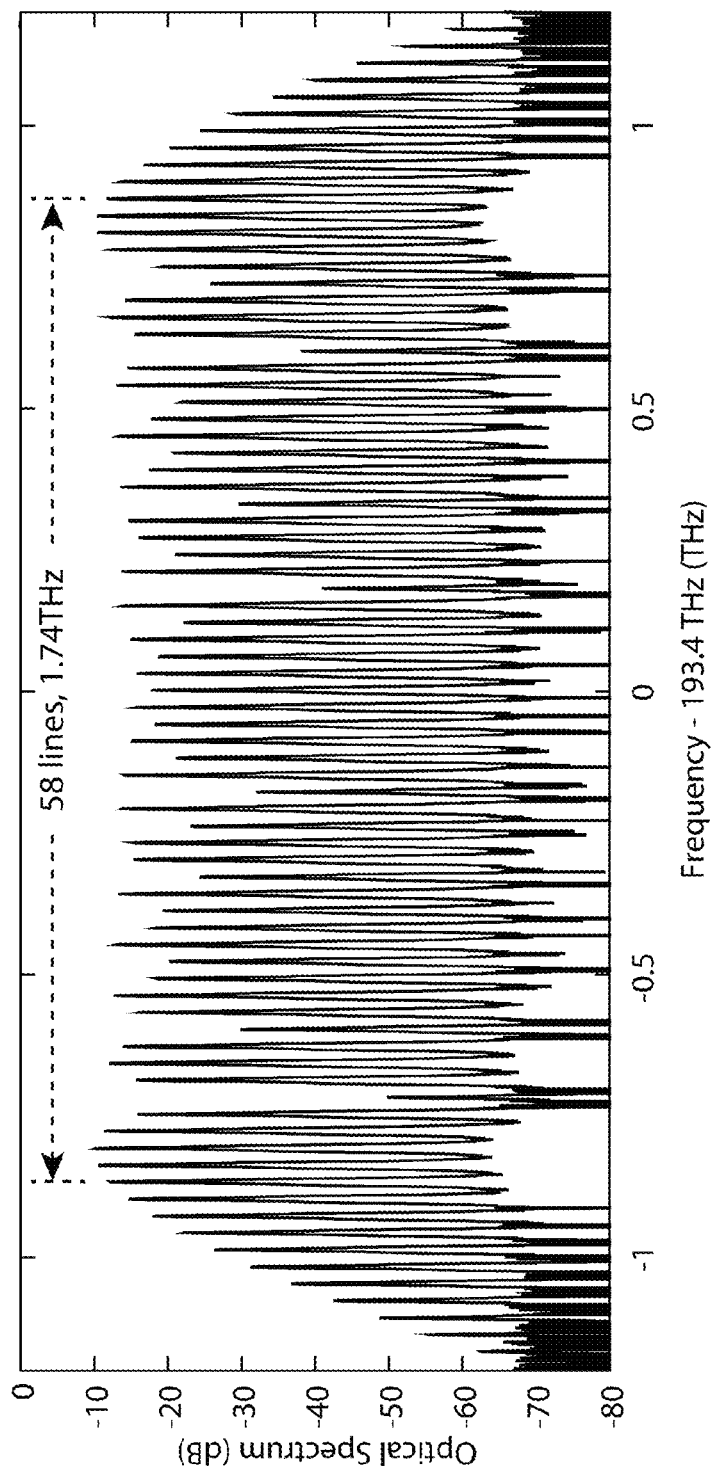
FIG. 7 is an example of an optical spectrum including multiple optical sidebands produced by phase modulation of an optical signal at a 30 GHz modulation frequency.

The scheme described in the preceding example can be carried further (resulting in an optical spectrum resembling the example shown in FIG. 7), with the phase modulator 222 (which can include one or more cascaded modulators) driven so as to generate from the optical output 40 multiple sidebands at optical frequencies $v_0 \pm Nf_M$, where N is an integer. Two of the sidebands are selected to act as the pump optical signal 20 and the second pump optical signal 30, at respective optical frequencies $v_1=v_0 \pm N_1 f_M$ and $v_2=v_0 \pm N_2 f_M$, where $N_1$ and $N_2$ are integers. The first pump optical frequency $v_1$ is locked to the fiber-ring optical resonator 100 using the frequency-locking mechanism 300 to control the optical frequency $v_0$ (as described above). If frequency fluctuations and phase noise on the modulator drive signal at the frequency $f_M$ are sufficiently small, then a separate frequency-locking mechanism for the second pump optical signal 30 may not be needed, and the pump laser sources 200/210 can be used in the arrangement of FIG. 2. However, frequency fluctuations and phase noise of the second pump optical signal 30 tend to increase (relative to those of the pump optical signal 20) with an increasing number if intervening sidebands. In some examples, it may be necessary to employ a second frequency-locking mechanism 310 to control $f_M$ and thereby lock the second pump optical frequency $v_2$ to a resonant mode of the fiber-ring resonator 100 (as in the arrangement of FIG. 3); if that is needed, a portion of the second pump optical signal 30 is split of and launched into the fiber-ring optical resonator 100 to propagate in the backward direction to enable such frequency control (described further below in the context of the next example).

Figure 8:
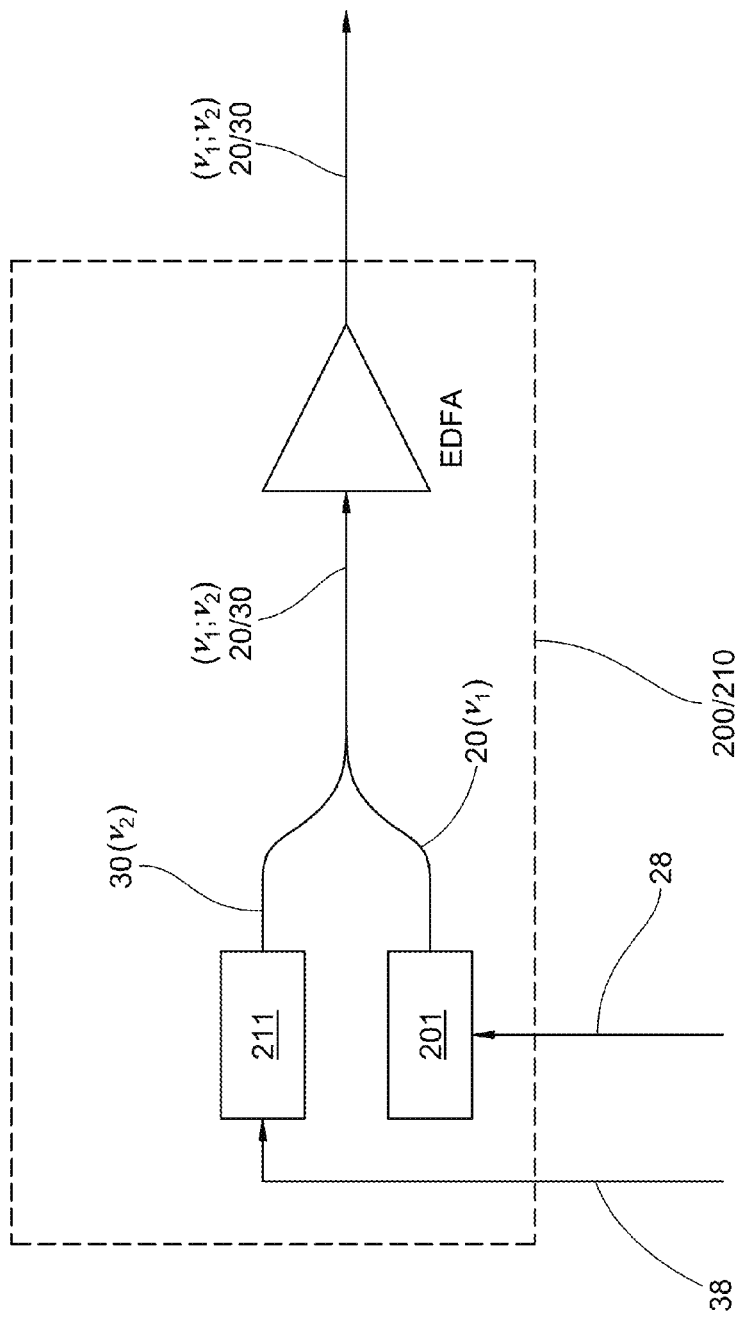
FIG. 8 illustrates schematically an example of pump laser sources arranged to produce pump optical signals at pump optical frequencies $v_1$ and $v_2$.

In another example (illustrated schematically in FIG. 8), the pump laser source 200 and the second pump laser source 210 include separate, independent pump lasers 201 and 211, respectively. In such an arrangement, each laser source 200/210 can exhibit frequency fluctuations and phase noise independent of the other's frequency fluctuations or phase noise. In some examples, the pump laser sources 200 and 210 comprise entirely separate sets of components. In other examples, while operating independently, the pump laser source 200 and the second pump laser source 210 can share some components; e.g., in the example shown, both pump laser sources 200/210 share a common fiber amplifier. In examples in which the pump laser sources 200/210 operate independently, the laser source 10 includes a second frequency-locking mechanism 310 coupling the second laser source 210 and the fiber-ring resonator 100 (e.g., as in the arrangement of FIG. 3).

Figure 9:
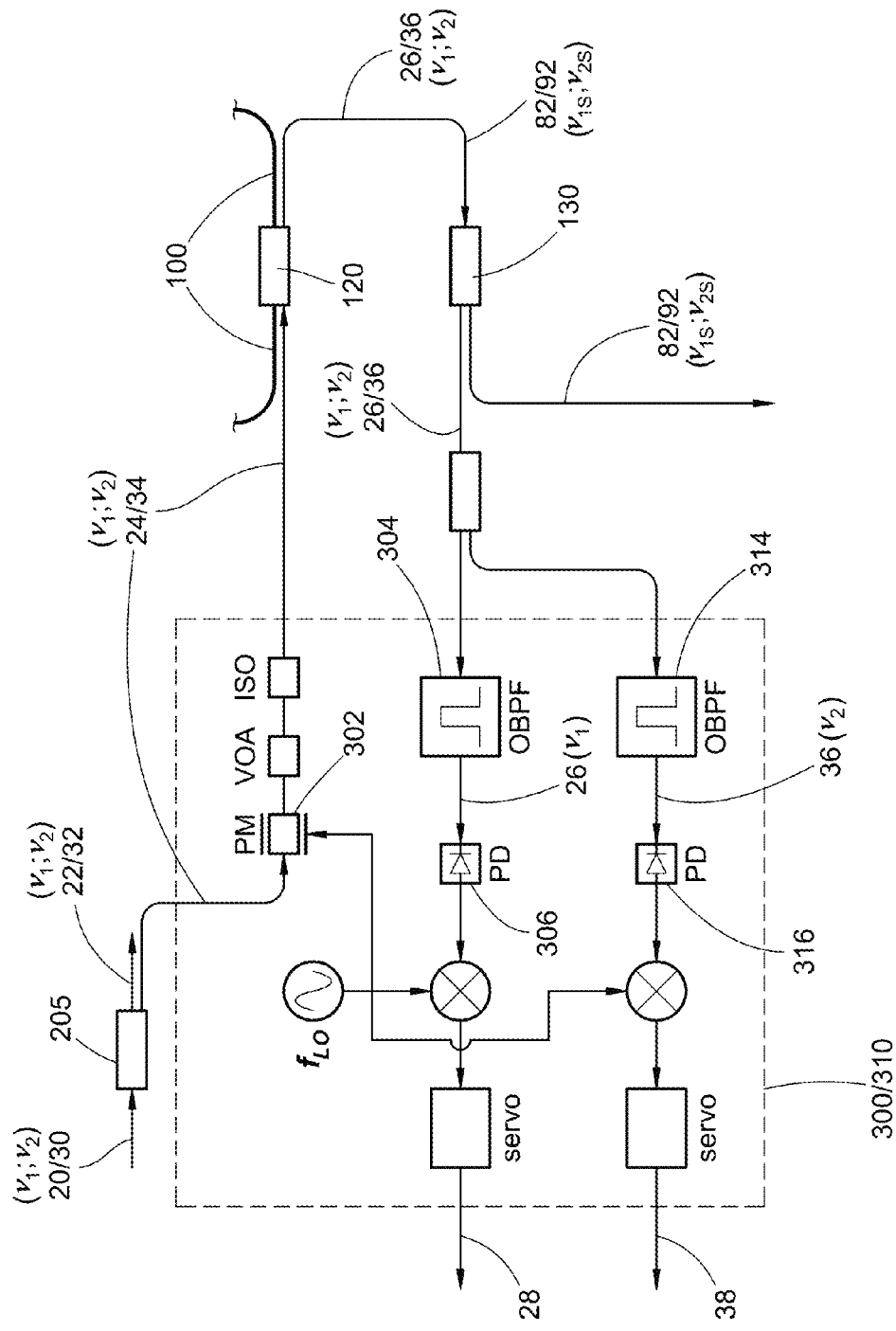
FIG. 9 illustrates schematically an example of a dual frequency-locking mechanism.

An example is shown in FIG. 9 of frequency-locking mechanisms 300/310 that are suitable for use in the arrangement of FIG. 3. The electrical laser-control signal 28 generated by the frequency locking mechanism 300 is applied to the pump laser 201, in a manner similar to that described above. The second pump laser source 210 is arranged so as to launch into the fiber-ring optical resonator 100 via the optical coupler 120 a second input portion 34 of the second pump optical signal 30 to propagate in the backward direction. In some examples (including the one shown), the second input portion 34 can be split off from the second pump optical signal 30 by the same splitter 205 that splits the second input portion 24 from the pump optical signal 20 (through which the pump optical signals 20/30 co-propagate); in other examples, separate splitters can be employed at a point before the pump optical signals 20/30 are combined to co-propagate to the optical circulator 110. The optical coupler 120 directs out of the fiber-ring optical resonator 100 an output portion 36 of the second input portion 34 of the second pump optical signal 30 to act as an optical feedback signal to the second frequency-locking mechanism 310. The second frequency-locking mechanism 310 controls the second pump optical frequency $v_2$, by applying a second electrical laser-control signal 38 to the pump laser 211, to maintain resonant propagation of the second input portion 34 of the second pump optical signal 30 around the fiber-ring optical resonator 100 in the backward direction. This can be achieved in any of the ways and for any of the reasons described above for control of the pump optical frequency $v_1$ by the frequency-locking mechanism 300.

In a given laser source 10, both frequency-locking mechanisms 300/310 can operate in the same manner (e.g., both Pound-Drever-Hall mechanisms, as in the example of FIG. 9; the mechanism 310 includes, inter alia, an optical bandpass filter 314 and photodiode 316), or they can operate differently from each other. In some examples, the frequency-locking mechanisms 300 and 310 comprise entirely separate sets of components. In other examples, while operating independently, the frequency-locking mechanisms 300/310 can share one or more common components; e.g., in the example of FIG. 9, the frequency-locking mechanisms 300/310 share a common modulator 302, local oscillator operating at $f_{LO}$, variable optical attenuator, and optical isolator, and both optical signals 24/34 are coupled into the fiber-ring optical resonator 100 by the same optical coupler 120.

If needed or desired, additional pump laser sources, operating at corresponding additional, different pump optical frequencies, can be employed to generate additional optical outputs from the laser source 10.

The laser source 10, when operated to produce two optical outputs 82/92 at respective optical frequencies $v_{1S}$ and $v_{2S}$, can be arranged so as to exhibit fluctuations of an output optical difference frequency $|v_{2S}-v_{1S}|$ only within an operationally acceptable bandwidth. The term "operationally acceptable" is necessarily a context-sensitive descriptor, and can vary from one instance to the next based on such considerations as minimum required performance criteria for a given use, or limitations of space, cost, complexity, power consumption, or maintenance. In some examples, the laser source 10 can be arranged so as to exhibit fluctuations of an output optical difference frequency $|v_{2S}-v_{1S}|$, over about a 0.1 second timescale, only within a bandwidth less than about 100 Hz. In some examples, the laser source 10 can be arranged so as to exhibit fluctuations of an output optical difference frequency $|v_{2S}-v_{1S}|$, over about a 0.1 second timescale, only within a bandwidth less than about 0.1 Hz. The use of a single fiber-ring resonator 100 to generate output optical signals at both optical frequencies $v_{1S}$ and $v_{2S}$ significantly reduces noise in the signal at the output optical difference frequency $|v_{2S}-v_{1S}|$, because many sources of so-called technical noise (i.e., noise arising from instabilities in environment or equipment, as opposed to quantum noise inherent in the physics of the system) are shared between the two optical outputs 82/92, and therefore cancel out at the optical difference frequency.

One application of the laser source 10, when arranged to produce two optical outputs 82/92 at the two optical frequencies $v_{1S}$ and $v_{2S}$, is to produce a stable electrical reference signal 99 in the radio-frequency or microwave-frequency range (e.g., 100s of MHz to 100s of GHz). One simple way to generate such an electrical signal 99 (e.g., as in the example of FIG. 10), when the output optical difference frequency $|v_{1S}-v_{2S}|$ is less than about 100 GHz, is to direct at least portions of the two output signals 82/92 (at respective optical frequencies $v_{1S}$ and $v_{2S}$) onto a photodetector 400, e.g., a photodiode. Typically it might be necessary to filter out one or more other optical frequencies (e.g., $v_1$ or $v_2$) that are present along with the frequencies $v_{1S}$ and $v_{2S}$ before directing the optical outputs 82/92 onto the photodetector 400, using one or more optical bandpass filters of any suitable type. Those other frequencies are coupled out of the fiber-ring resonator 100 by the coupler 120, e.g., as the optical feedback signal 26 or the second optical feedback signal 36, along with the optical outputs 82/92. The electrical output of the photodetector 400 includes a beat component at the output optical difference frequency $|v_{1S}-v_{2S}|$; that beat component (i.e., the beat note) serves as the output electrical signal 99 and exhibits exceptionally low phase noise relative to other electrical frequency references available in the radio- or microwave-frequency ranges. The frequency of the electrical signal generated by this direct beating of the optical output signals 82/92 on the photodetector 400 is limited by the bandwidth of the photodetector 400, typically to about 100 GHz or less.

Frequencies between 5 GHz and 50 GHz are commonly employed as frequency references and can be readily generated as described above.

Figure 11:
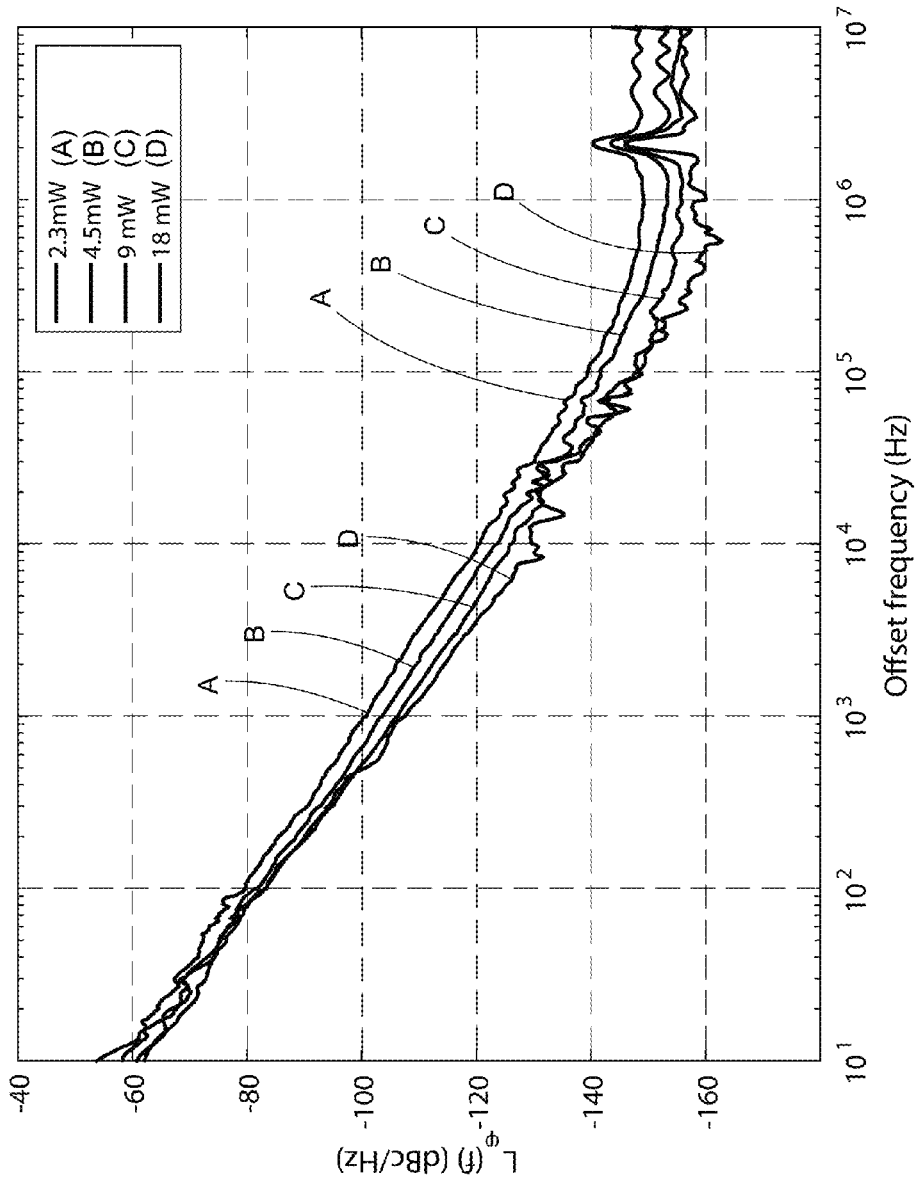
FIG. 11 includes examples of noise spectra for different optical output power levels of an electrical signal at the output optical difference frequency $|v_{1S} - v_{2S}|$ at about 10 GHz produced according to the arrangement of FIG. 10.
Figure 13:
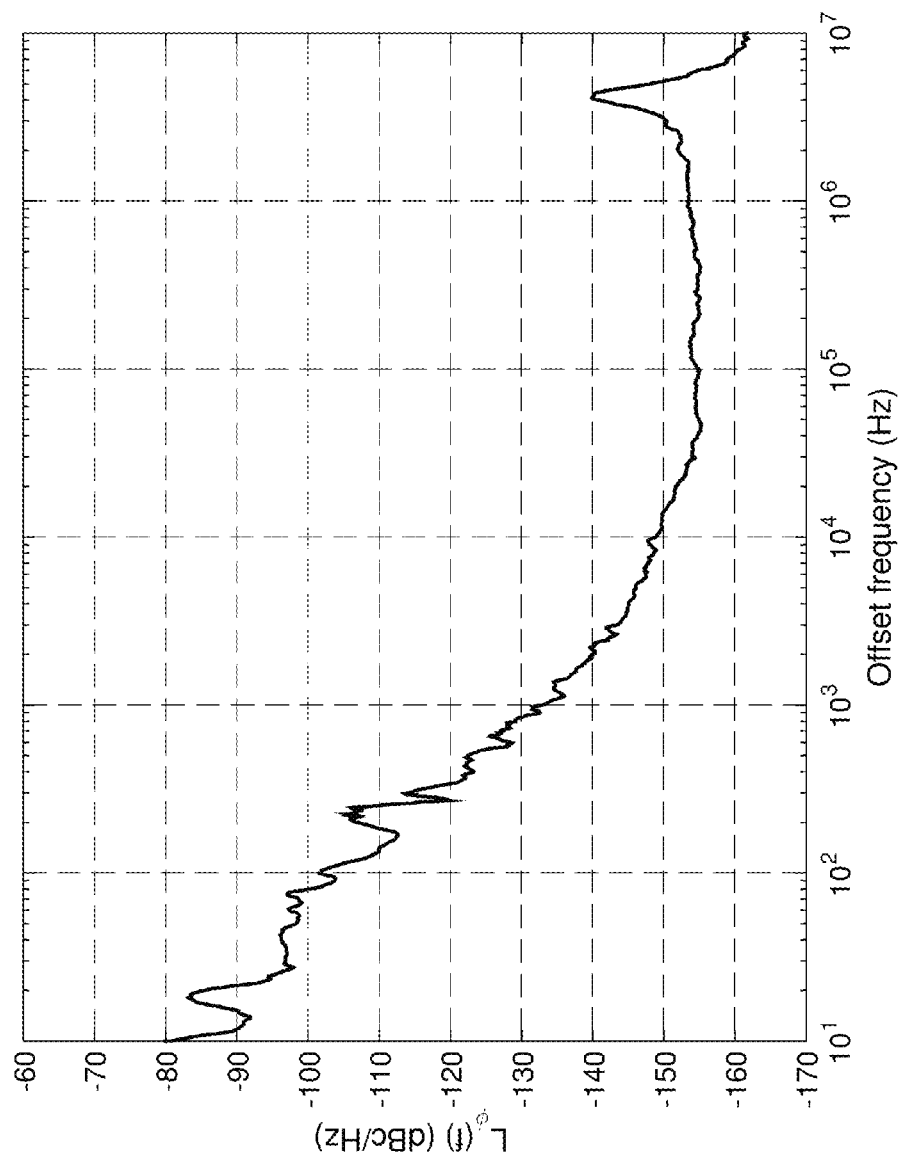
FIG. 13 includes an example of a noise spectrum of an electrical signal at an electrical output frequency $f_D$ at about 30 GHz from an output optical difference frequency $|v_{1S} - v_{2S}|$ at about 720 GHz (N=24) according to the arrangement of FIG. 12B.

The laser source 10 is arranged so as to exhibit phase noise of the electrical output signal 99 at the output optical difference frequency $|v_{1S}-v_{2S}|$ less than an operationally acceptable reference phase noise level. As noted above, "operationally acceptable" is a context-sensitive limitation. In some examples, the laser source 10 can be arranged so as to exhibit phase noise of the electrical output signal 99 at the output optical difference frequency $|v_{1S}-v_{2S}|$ less than about −90 dBc/Hz at 1 kHz offset frequency and less than about −110 dBc/Hz at 10 kHz offset frequency. In some examples, the laser source 10 can be arranged so as to exhibit phase noise of the electrical output signal 99 at the output optical difference frequency $|v_{1S}-v_{2S}|$ less than about −110 dBc/Hz at 1 kHz offset frequency and less than about −130 dBc/Hz at 10 kHz offset frequency. Examples of noise spectra for electrical signals 99 generated in this way are shown in FIG. 11, and exhibit the expected (for Schawlow-Townes noise) roughly $1/f^2$ dependence of the noise on the offset frequency and roughly inverse dependence on the output power. Further reduction in the phase noise of the electrical signal can be achieved by electrical frequency division of the electrical signal 99. An electrical frequency divider 402 of any suitable type (shown in an alternative electrical signal path in FIG. 10) can be arranged to receive the electrical signal 99 at the optical difference frequency $|v_{1S}-v_{2S}|$, and to generate therefrom an electrical output signal 98 at the frequency $|v_{1S}-v_{2S}|/N$, wherein N is an integer. Division of the frequency by N has the effect of reducing the phase noise by a factor of $N^2$. For example, generating the electrical signal 98 at about 10 GHz by dividing by N=4 the frequency of the electrical signal 99 at about 40 GHz yields about a 16-fold reduction of phase noise; generating the electrical signal 98 at about 10 GHz by dividing by N=10 the frequency of the electrical signal 99 at about 100 GHz yields about a 100-fold reduction of phase noise.

Still further reductions of phase noise can be achieved by generating optical output signals 82/92 at corresponding output optical frequencies $v_{1S}$ and $v_{2S}$ that are more than about 100 GHz apart, and employing optical or electro-optical frequency division to produce an electrical output signal 97 at a frequency $f_D$. The frequency $f_D$ is about equal to $|v_{1S}-v_{2S}|/N$, where N is an integer that defines the division factor of the divider. In some examples, the two optical outputs 82/92 from the laser source 10 (at respective optical frequencies $v_{1S}$ and $v_{2S}$) are directed into an optical frequency divider 503 of any suitable type (e.g., as in FIG. 12A) or an electro-optical frequency divider 507 of any suitable type (e.g., as in FIG. 12B; including one or more phase modulators operated at the frequency $f_D$). The optical or electro-optical frequency divider 503 or 507 is arranged so as to receive the optical outputs 82/92 from the laser source 10 and to generate therefrom a stabilized electrical output signal 97 at the frequency $f_D$. Examples of suitable electro-optical frequency dividers are disclosed in, e.g., U.S. Pat. No. 9,450,673 and U.S. Pub. No. 2016/0254646 (each incorporated above). An example of a suitable optical frequency divider is disclosed in, e.g., the publication of Swann et al (incorporated above). Other suitable types of optical or electro-optical frequency dividers can be employed.

The output optical frequencies $v_{1S}$ and $v_{2S}$ can be selected so that the output optical difference frequency $|v_{1S}-v_{2S}|$ is greater than about 300 GHz, greater than about 1 THz, greater than about 10 THz, or greater than about 100 THz. The frequency $f_D$ of the output electrical signal 97 can be between about 0.3 GHz and about 300 GHz, between about 1 GHz and about 100 GHz, or between about 5 GHz and about 50 GHz; frequencies between about 5 GHz and about 50 GHz are commonly desired. The frequency $f_D$ of the electrical output signal 97 is about equal to $|v_{1S}-v_{2S}|/N$, where N is an integer that defines the nominal division factor of the optical divider 503 or the electro-optical divider 507. The reduction of phase noise in the output electrical signal 97 at the frequency $f_D$ is reduced, relative to the phase noise of the output optical difference frequency $|v_{1S}-v_{2S}|$, by roughly a factor of $(|v_{1S}-v_{2S}|/f_D)^2$ (i.e., roughly $N^2$). For example, for output optical frequencies $v_{1S}$ and $v_{2S}$ separated by about 300 GHz and $f_D$ at about 10 GHz, the reduction of phase noise is about 900-fold; for output optical frequencies $v_{1S}$ and $v_{2S}$ separated by about 1 THz and $f_D$ at about 10 GHz, the reduction of phase noise is about 10,000-fold. The laser source 10 or the optical or electro-optical frequency divider 503 or 507 is arranged so as to limit phase noise of the electrical output signal at the frequency $f_D$ to less than an operationally acceptable reference phase noise level (which is context-sensitive). In some examples, the laser source 10 or the divider 503 or 507 can be stabilized so as to limit phase noise of the electrical output signal at the frequency $f_D$ to less than about $[-90-20\cdot\log(|v_{1S}-v_{2S}|/f_D)]$ dBc/Hz at 1 kHz offset frequency and less than about $[-110-20\cdot\log(|v_{1S}-v_{2S}|/f_D)]$ dBc/Hz at 10 kHz offset frequency. In some examples, the laser source 10 or the divider 503 or 507 can be stabilized so as to limit phase noise of the electrical output signal at the frequency $f_D$ to less than about $[-110-20\cdot\log(|v_{1S}-v_{2S}|/f_D)]$ dBc/Hz at 1 kHz offset frequency and less than about $[-130-20\cdot\log(|v_{1S}-v_{2S}|/f_D)]$ dBc/Hz at 10 kHz offset frequency.

In addition to the preceding, the following examples fall within the scope of the present disclosure or appended claims:

EXAMPLE 1

A laser source comprising: (a) a fiber-ring optical resonator including an optical circulator and an optical coupler, wherein the fiber-ring optical resonator is characterized by a Brillouin shift frequency $v_B$, and wherein the optical circulator is arranged so as to (i) limit to a single round trip propagation of an optical signal around the fiber-ring optical resonator in a forward direction, and (ii) permit resonant propagation of an optical signal around the fiber-ring optical resonator in a backward direction; (b) a pump laser source that arranged so as to (i) produce a pump optical signal characterized by a pump optical frequency $v_1$, (ii) launch into the fiber-ring optical resonator via the optical circulator a first input portion of the pump optical signal to propagate in the forward direction, and (iii) launch into the fiber-ring optical resonator via the optical coupler a second input portion of the pump optical signal to propagate in the backward direction; and (c) a frequency-locking mechanism coupling the pump laser source and the fiber-ring optical resonator, wherein the frequency-locking mechanism is arranged so as to control the pump optical frequency $v_1$ to maintain resonant propagation of the second input portion of the pump optical signal around the fiber-ring optical resonator in the backward direction, wherein: (d) the fiber-ring optical resonator is arranged so as to produce from the first input portion of the pump optical signal a Brillouin laser optical signal, at a Brillouin laser frequency $v_{1S}=v_1-v_B$, that resonantly propagates around the fiber-ring optical resonator in the backward direction; and (e) the optical coupler is arranged so as to direct out of the fiber-ring optical resonator (i) an output portion of the second input portion of the pump optical signal, at the pump optical frequency $v_1$, to act as an optical feedback signal to the frequency-locking mechanism, and (ii) an output portion of the Brillouin laser optical signal, at the Brillouin laser frequency $v_{1S}$, to act as optical output of the laser source.

EXAMPLE 2

The laser source of Example 1 wherein the pump optical frequency $v_1$ is between about 75 THz and about 750 THz.

EXAMPLE 3

The laser source of Example 1 wherein the pump optical frequency $v_1$ is between about 120 THz and about 430 THz.

EXAMPLE 4

The laser source of Example 1 wherein the pump optical frequency $v_1$ is between about 150 THz and about 300 THz.

EXAMPLE 5

The laser source of any one of Examples 1 through 4 wherein the frequency-locking mechanism includes a Pound-Drever-Hall mechanism.

EXAMPLE 6

The laser source of any one of Examples 1 through 4 wherein the frequency-locking mechanism includes a Hänsch-Couillaud mechanism.

EXAMPLE 7

The laser source of any one of Examples 1 through 6 wherein the fiber-ring optical resonator includes an optical fiber greater than or equal to about 40 meters long.

EXAMPLE 8

The laser source of any one of Examples 1 through 6 wherein the fiber-ring optical resonator includes an optical fiber greater than or equal to about 100 meters long.

EXAMPLE 9

The laser source of any one of Examples 1 through 6 wherein the fiber-ring optical resonator includes an optical fiber greater than or equal to about 200 meters long.

EXAMPLE 10

The laser source of any one of Examples 1 through 6 wherein the fiber-ring optical resonator includes an optical fiber greater than or equal to about 500 meters long.

EXAMPLE 11

The laser source of any one of Examples 1 through 10 wherein the fiber-ring optical resonator comprises silica optical fiber and the Brillouin shift frequency $v_B$ is about 10.9 GHz.

EXAMPLE 12

A method employing the laser source of any one of Examples 1 through 11, the method comprising: (A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S}=v_1-v_B$, that resonantly propagates around the fiber-ring optical resonator in the backward direction; (B) launching into the fiber-ring optical resonator via the optical coupler the second input portion of the pump optical signal to propagate in the backward direction; (C) using the optical coupler, directing out of the fiber-ring optical resonator the output portion of the second input portion of the pump optical signal, at the pump optical frequency $v_1$, to act as the optical feedback signal to the frequency-locking mechanism; (D) using the frequency-locking mechanism, controlling the pump optical frequency $v_1$ to maintain resonant propagation of the second input portion of the pump optical signal around the fiber-ring optical resonator in the backward direction; and (E) using the optical coupler, directing out of the fiber-ring optical resonator the output portion of the Brillouin laser optical signal, at the Brillouin laser frequency $v_{1S}$, to act as the optical output of the laser source.

EXAMPLE 13

The laser source of any one of Examples 1 through 11 wherein: (b') the laser source further comprises a second pump laser source that is arranged so as to (i) produce a second pump optical signal characterized by a second pump optical frequency $v_2$, and (ii) launch into the fiber-ring optical resonator via the optical circulator a first input portion of the second pump optical signal to propagate in the forward direction; (d') the fiber-ring optical resonator is arranged so as to produce from the first input portion of the second pump optical signal a second Brillouin laser optical signal, at a second Brillouin laser frequency $v_{2S}=v_2-v_B$, that resonantly propagates around the fiber-ring optical resonator in the backward direction; and (e') the optical coupler is arranged so as to direct out of the fiber-ring optical resonator an output portion of the second Brillouin laser optical signal, at the second Brillouin laser frequency $v_{2S}$, to act as second optical output of the laser source.

EXAMPLE 14

The laser source of Example 13 wherein the pump frequency $v_1$ and the second pump frequency $v_2$ are each between about 75 THz and about 750 THz.

EXAMPLE 15

The laser source of Example 13 wherein the pump frequency $v_1$ and the second pump frequency $v_2$ are each between about 120 THz and about 430 THz.

EXAMPLE 16

The laser source of Example 13 wherein the pump frequency $v_1$ and the second pump frequency $v_2$ are each between about 150 THz and about 300 THz.

EXAMPLE 17

The laser source of any one of Examples 13 through 16 wherein the laser source is arranged so as to exhibit fluctuations of an output optical difference frequency $|v_{2S}-v_{1S}|$ only within an operationally acceptable bandwidth.

EXAMPLE 18

The laser source of any one of Examples 13 through 16 wherein the laser source is arranged so as to exhibit fluctuations of an output optical difference frequency $|v_{2S}-v_{1S}|$, over about a 0.1 second timescale, only within a bandwidth less than about 100 Hz.

EXAMPLE 19

The laser source of any one of Examples 13 through 16 wherein the laser source is arranged so as to exhibit fluctuations of an output optical difference frequency $|v_{2S}-v_{1S}|$, over about a 0.1 second timescale, only within a bandwidth less than about 0.1 Hz.

EXAMPLE 20

The laser source of any one of Examples 13 through 19 wherein the second pump laser source includes at least one phase modulator operated at a frequency $f_M$ and arranged so as to generate, from at least a portion of the pump optical signal at the pump optical frequency $v_1$, the second pump optical signal at the second pump optical frequency $v_2$, and the second pump optical frequency is either $v_2=v_1+f_M$ or $v_2=v_1-f_M$.

EXAMPLE 21

The laser source of any one of Examples 13 through 19 wherein pump laser source and the second pump laser source include a single pump laser, operated at an optical frequency $v_0$, and at least one phase modulator, operated at a frequency $f_M$ and arranged so as to generate, from at least a portion of optical output of the single pump laser at the optical frequency $v_0$, the pump optical signal and the second pump optical signal, and wherein either (i) the pump optical frequency is $v_1=v_0-f_M$ and the second pump optical frequency is $v_2=v_0+f_M$, or (ii) the pump optical frequency is $v_1=v_0+f_M$ and the second pump optical frequency is $v_2=v_0-f_M$.

EXAMPLE 22

The laser source of any one of Examples 13 through 19 wherein pump laser source and the second pump laser source include a single pump laser, operated at an optical frequency $v_0$, and at least one phase modulator, operated at a frequency $f_M$ and arranged so as to generate, from at least a portion of optical output of the single pump laser at the optical frequency $v_0$, the pump optical signal and the second pump optical signal, and wherein the pump optical frequency is $v_1=v_0\pm N_1 f_M$ and the second pump optical frequency is $v_2=v_0\pm N_2 f_M$, wherein $N_1$ and $N_2$ are integers.

EXAMPLE 23

A method employing the laser source of any one of Examples 13 through 22, the method comprising: (A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S}=v_1-v_B$, that resonantly propagates around the fiber-ring optical resonator in the backward direction; (A') launching from the second pump laser source into the fiber-ring optical resonator via the optical circulator the first input portion of the second pump optical signal, at the pump optical frequency $v_2$, to propagate in the forward direction and thereby produce, from the first input portion of the second pump optical signal, the second Brillouin laser optical signal, at the frequency $v_{2S}=v_2-v_B$, that resonantly propagates around the fiber-ring optical resonator in the backward direction; (B) launching into the fiber-ring optical resonator via the optical coupler the second input portion of the pump optical signal to propagate in the backward direction; (C) using the optical coupler, directing out of the fiber-ring optical resonator the output portion of the second input portion of the pump optical signal to act as the optical feedback signal to the frequency-locking mechanism; (D) using the frequency-locking mechanism, controlling the pump optical frequency $v_1$ to maintain resonant propagation of the second input portion of the pump optical signal around the fiber-ring optical resonator in the backward direction; (E) using the optical coupler, directing out of the fiber-ring optical resonator the output portion of the Brillouin laser optical signal to act as the optical output of the laser source; and (E') directing out of the fiber-ring optical resonator the output portion of the second Brillouin laser optical signal to act as the second optical output of the laser source.

EXAMPLE 24

The laser source of any one of Examples 13 through 22 wherein: (b") the second pump laser source is arranged so as to launch into the fiber-ring optical resonator via the optical coupler a second input portion of the second pump optical signal to propagate in the backward direction; (c") the laser source further comprises a second frequency-locking mechanism coupling the second pump laser source and the fiber-ring optical resonator, wherein the second frequency-locking mechanism is arranged so as to control the second pump optical frequency $v_2$ to maintain resonant propagation of the second input portion of the second pump optical signal around the fiber-ring optical resonator in the backward direction; and (e") the optical coupler is arranged so as to direct out of the fiber-ring optical resonator an output portion of the second input portion of the second pump optical signal to act as an optical feedback signal to the second frequency-locking mechanism.

EXAMPLE 25

A method employing the laser source of Example 24, the method comprising: (A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S}=v_1-v_B$, that resonantly propagates around the fiber-ring optical resonator in the backward direction; (A') launching from the second pump laser source into the fiber-ring optical resonator via the optical circulator the first input portion of the second pump optical signal, at the second pump optical frequency $v_2$, to propagate in the forward direction and thereby produce, from the first input portion of the second pump optical signal, the second Brillouin laser optical signal, at the second Brillouin laser frequency $v_{2S}=v_2-v_B$, that resonantly propagates around the fiber-ring optical resonator in the backward direction; (B) launching into the fiber-ring optical resonator via the optical coupler the second input portion of the pump optical signal to propagate in the backward direction; (B') launching into the fiber-ring optical resonator via the optical coupler the second input portion of the second pump optical signal to propagate in the backward direction; (C) using the optical coupler, directing out of the fiber-ring optical resonator the output portion of the second input portion of the pump optical signal to act as the optical feedback signal to the frequency-locking mechanism; (C') using the optical coupler, directing out of the fiber-ring optical resonator the output portion of the second input portion of the second pump optical signal to act as the optical feedback signal to the second frequency-locking mechanism; (D) using the frequency-locking mechanism, controlling the pump optical frequency $v_1$ to maintain resonant propagation of the second input portion of the pump optical signal around the fiber-ring optical resonator in the backward direction; (D') using the frequency-locking mechanism, controlling the second pump optical frequency $v_2$ to maintain resonant propagation of the second input portion of the second pump optical signal around the fiber-ring optical resonator in the backward direction; (E) using the optical coupler, directing out of the fiber-ring optical resonator the output portion of the Brillouin laser optical signal to act as the optical output of the laser source; and (E') directing out of the fiber-ring optical resonator the output portion of the second Brillouin laser optical signal to act as the second optical output of the laser source.

EXAMPLE 26

The laser source of any one of Examples 13 through 22 or Example 24 wherein an output optical difference frequency $|v_{1S}-v_{2S}|$ is less than about 100 GHz, and the laser source further comprises a photodetector arranged so as to receive the output and the second output of the laser source and to generate therefrom an electrical output signal at the output optical difference frequency $|v_{1S}-v_{2S}|$.

EXAMPLE 27

The laser source of Example 26 further comprising an electrical frequency divider arrange so as to provide a divided electrical output signal at the frequency $|v_{1S}-v_{2S}|/N$, wherein N is an integer.

EXAMPLE 28

The laser source of any one of Examples 26 or 27 wherein the laser source is arranged so as to exhibit phase noise of the electrical output signal at the output optical difference frequency $|v_{1S}-v_{2S}|$ less than an operationally acceptable reference phase noise level.

EXAMPLE 29

The laser source of any one of Examples 26 or 27 wherein the laser source is arranged so as to exhibit phase noise of the electrical output signal at the output optical difference frequency $|v_{1S}-v_{2S}|$ less than about −90 dBc/Hz at 1 kHz offset frequency and less than about −110 dBc/Hz at 10 kHz offset frequency.

EXAMPLE 30

The laser source of any one of Examples 26 or 27 wherein the laser source is arranged so as to exhibit phase noise of the electrical output signal at the output optical difference frequency $|v_{1S}-v_{2S}|$ less than about −110 dBc/Hz at 1 kHz offset frequency and less than about −130 dBc/Hz at 10 kHz offset frequency.

EXAMPLE 31

A method employing the laser source of any one of Examples 26 through 30, the method comprising: (A) receiving at the photodetector the optical output and the second optical output of the laser source; and (B) using the photodiode, generating from the optical output and the second optical output the electrical output signal at the output optical difference frequency $|v_{1S}-v_{2S}|$.

EXAMPLE 32

The laser source of any one of Examples 13 through 22 or Example 24 wherein an output optical difference frequency $|v_{1S}-v_{2S}|$ is greater than about 100 GHz, and the laser source further comprises an optical or electro-optical frequency divider that is arranged so as to receive the optical output and the second optical output of the laser source and to generate therefrom a stabilized electrical output signal at an electrical output frequency $f_D$ that is less than the output optical difference frequency $|v_{1S}-v_{2S}|$.

EXAMPLE 33

The laser source of Example 32 wherein the output optical difference frequency $|v_{1S}-v_{2S}|$ is greater than about 300 GHz, greater than about 1 THz, greater than about 10 THz, or greater than about 100 THz.

EXAMPLE 34

The laser source of any one of Examples 32 or 33 wherein the frequency $f_D$ is between about 0.3 GHz and about 300 GHz, between about 1 GHz and about 100 GHz, or between about 5 GHz and about 50 GHz.

EXAMPLE 35

The laser source of any one of Examples 32 through 34 wherein the laser source or the optical or electro-optical frequency divider is arranged so as to limit phase noise of the electrical output signal at the frequency $f_D$ to less than an operationally acceptable reference phase noise level.

EXAMPLE 36

The laser source of any one of Examples 32 through 34 wherein the laser source or the optical or electro-optical frequency divider is stabilized so as to limit phase noise of the electrical output signal at the frequency $f_D$ to less than about $[-90-20\cdot\log(|v_{1S}-v_{2S}|/f_D)]$ dBc/Hz at 1 kHz offset frequency and less than about $[-110-20\cdot\log(|v_{1S}-v_{2S}|/f_D)]$ dBc/Hz at 10 kHz offset frequency.

EXAMPLE 37

The laser source of any one of Examples 32 through 34 wherein the laser source or the optical or electro-optical frequency divider is stabilized so as to limit phase noise of the electrical output signal at the frequency $f_D$ to less than about $[-110-20\cdot\log(|v_{1S}-v_{2S}|/f_D)]$ dBc/Hz at 1 kHz offset frequency and less than about $[-130-20 \cdot \log(|v_{1S}-v_{2S}|/f_D)]$ dBc/Hz at 10 kHz offset frequency.

EXAMPLE 38

A method employing the laser source of any one of Examples 32 through 37, the method comprising: (A) receiving at the optical or electro-optical frequency divider the optical output and the second optical output of the laser source; and (B) using the received optical output and the received second optical output, generating with the optical or electro-optical frequency divider the stabilized electrical output signal at the frequency $f_D$.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an example or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the example or claim or, in some instances, it will be implicit or inherent based on the specific content of the example or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A laser source comprising:
   (a) a fiber-ring optical resonator including an optical circulator and an optical coupler, wherein the fiber-ring optical resonator is characterized by a Brillouin shift frequency $v_B$, and wherein the optical circulator is arranged so as to (i) limit to a single round trip propagation of an optical signal around the fiber-ring optical resonator in a forward direction, and (ii) permit resonant propagation of an optical signal around the fiber-ring optical resonator in a backward direction;
   (b) a pump laser source that arranged so as to (i) produce a pump optical signal characterized by a pump optical frequency $v_1$, (ii) launch into the fiber-ring optical resonator via the optical circulator a first input portion of the pump optical signal to propagate in the forward direction, and (iii) launch into the fiber-ring optical resonator via the optical coupler a second input portion of the pump optical signal to propagate in the backward direction; and
   (c) a frequency-locking mechanism coupling the pump laser source and the fiber-ring optical resonator, wherein the frequency-locking mechanism is arranged so as to control the pump optical frequency $v_1$ to maintain resonant propagation of the second input portion of the pump optical signal around the fiber-ring optical resonator in the backward direction, wherein:

(d) the fiber-ring optical resonator is arranged so as to produce from the first input portion of the pump optical signal a Brillouin laser optical signal, at a Brillouin laser frequency $v_{1S}=v_1-v_B$, that resonantly propagates around the fiber-ring optical resonator in the backward direction; and (e) the optical coupler is arranged so as to direct out of the fiber-ring optical resonator (i) an output portion of the second input portion of the pump optical signal, at the pump optical frequency $v_1$, to act as an optical feedback signal to the frequency-locking mechanism, and (ii) an output portion of the Brillouin laser optical signal, at the Brillouin laser frequency $v_{1S}$, to act as optical output of the laser source.

2. The laser source of claim 1 wherein the pump optical frequency $v_1$ is between about 75 THz and about 750 THz.

3. The laser source of claim 1 wherein the pump optical frequency $v_1$ is between about 120 THz and about 430 THz.

4. The laser source of claim 1 wherein the pump optical frequency $v_1$ is between about 150 THz and about 300 THz.

5. The laser source of claim 1 wherein the frequency-locking mechanism includes a Pound-Drever-Hall mechanism.

6. The laser source of claim 1 wherein the frequency-locking mechanism includes a Hänsch-Couillaud mechanism.

7. The laser source of claim 1 wherein the fiber-ring optical resonator includes an optical fiber greater than or equal to about 40 meters long.

8. The laser source of claim 1 wherein the fiber-ring optical resonator includes an optical fiber greater than or equal to about 100 meters long.

9. The laser source of claim 1 wherein the fiber-ring optical resonator includes an optical fiber greater than or equal to about 200 meters long.

10. The laser source of claim 1 wherein the fiber-ring optical resonator includes an optical fiber greater than or equal to about 500 meters long.

11. The laser source of claim 1 wherein the fiber-ring optical resonator comprises silica optical fiber and the Brillouin shift frequency $v_B$ is about 10.9 GHz.

12. A method employing the laser source of claim 1, the method comprising:

(A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S}=v_1-v_B$, that resonantly propagates around the fiber-ring optical resonator in the backward direction;

(B) launching into the fiber-ring optical resonator via the optical coupler the second input portion of the pump optical signal to propagate in the backward direction;

(C) using the optical coupler, directing out of the fiber-ring optical resonator the output portion of the second input portion of the pump optical signal, at the pump optical frequency $v_1$, to act as the optical feedback signal to the frequency-locking mechanism;

(D) using the frequency-locking mechanism, controlling the pump optical frequency $v_1$ to maintain resonant propagation of the second input portion of the pump optical signal around the fiber-ring optical resonator in the backward direction; and (E) using the optical coupler, directing out of the fiber-ring optical resonator the output portion of the Brillouin laser optical signal, at the Brillouin laser frequency $v_{1S}$, to act as the optical output of the laser source.

13. The laser source of claim 1 wherein:

(b') the laser source further comprises a second pump laser source that is arranged so as to (i) produce a second pump optical signal characterized by a second pump optical frequency $v_2$, and (ii) launch into the fiber-ring optical resonator via the optical circulator a first input portion of the second pump optical signal to propagate in the forward direction;

(d') the fiber-ring optical resonator is arranged so as to produce from the first input portion of the second pump optical signal a second Brillouin laser optical signal, at a second Brillouin laser frequency $v_{2S}=v_2-v_B$, that resonantly propagates around the fiber-ring optical resonator in the backward direction; and (e') the optical coupler is arranged so as to direct out of the fiber-ring optical resonator an output portion of the second Brillouin laser optical signal, at the second Brillouin laser frequency $v_{2S}$, to act as second optical output of the laser source.

14. The laser source of claim 13 wherein the pump frequency $v_1$ and the second pump frequency $v_2$ are each between about 75 THz and about 750 THz.

15. The laser source of claim 13 wherein the pump frequency $v_1$ and the second pump frequency $v_2$ are each between about 120 THz and about 430 THz.

16. The laser source of claim 13 wherein the pump frequency $v_1$ and the second pump frequency $v_2$ are each between about 150 THz and about 300 THz.

17. The laser source of claim 13 wherein the laser source is arranged so as to exhibit fluctuations of an output optical difference frequency $|v_{2S}-v_{1S}|$ only within an operationally acceptable bandwidth.

18. The laser source of claim 13 wherein the laser source is arranged so as to exhibit fluctuations of an output optical difference frequency $|v_{2S}-v_{1S}|$, over about a 0.1 second timescale, only within a bandwidth less than about 100 Hz.

19. The laser source of claim 13 wherein the laser source is arranged so as to exhibit fluctuations of an output optical difference frequency $|v_{2S}-v_{1S}|$, over about a 0.1 second timescale, only within a bandwidth less than about 0.1 Hz.

20. The laser source of claim 13 wherein the second pump laser source includes at least one phase modulator operated at a frequency $f_M$ and arranged so as to generate, from at least a portion of the pump optical signal at the pump optical frequency $v_1$, the second pump optical signal at the second pump optical frequency $v_2$, and the second pump optical frequency is either $v_2=v_1+f_M$ or $v_2=v_1-f_M$.

21. The laser source of claim 13 wherein pump laser source and the second pump laser source include a single pump laser, operated at an optical frequency $v_0$, and at least one phase modulator, operated at a frequency $f_M$ and arranged so as to generate, from at least a portion of optical output of the single pump laser at the optical frequency $v_0$, the pump optical signal and the second pump optical signal, and wherein either (i) the pump optical frequency is $v_1=v_0-f_M$ and the second pump optical frequency is $v_2=v_0+f_M$, or (ii) the pump optical frequency is $v_1=v_0+f_M$ and the second pump optical frequency is $v_2=v_0-f_M$.

22. The laser source of claim 13 wherein pump laser source and the second pump laser source include a single pump laser, operated at an optical frequency $v_0$, and at least one phase modulator, operated at a frequency $f_M$ and arranged so as to generate, from at least a portion of optical output of the single pump laser at the optical frequency $v_0$, the pump optical signal and the second pump optical signal, and wherein the pump optical frequency is $v_1 = v_0 \pm N_1 f_M$ and the second pump optical frequency is $v_2 = v_0 \pm N_2 f_M$, wherein $N_1$ and $N_2$ are integers.

23. A method employing the laser source of claim 13, the method comprising:
   (A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S} = v_1 - v_B$, that resonantly propagates around the fiber-ring optical resonator in the backward direction;
   (A') launching from the second pump laser source into the fiber-ring optical resonator via the optical circulator the first input portion of the second pump optical signal, at the pump optical frequency $v_2$, to propagate in the forward direction and thereby produce, from the first input portion of the second pump optical signal, the second Brillouin laser optical signal, at the frequency $v_{2S} = v_2 - v_B$, that resonantly propagates around the fiber-ring optical resonator in the backward direction;
   (B) launching into the fiber-ring optical resonator via the optical coupler the second input portion of the pump optical signal to propagate in the backward direction;
   (C) using the optical coupler, directing out of the fiber-ring optical resonator the output portion of the second input portion of the pump optical signal to act as the optical feedback signal to the frequency-locking mechanism;
   (D) using the frequency-locking mechanism, controlling the pump optical frequency $v_1$ to maintain resonant propagation of the second input portion of the pump optical signal around the fiber-ring optical resonator in the backward direction;
   (E) using the optical coupler, directing out of the fiber-ring optical resonator the output portion of the Brillouin laser optical signal to act as the optical output of the laser source; and
   (E') directing out of the fiber-ring optical resonator the output portion of the second Brillouin laser optical signal to act as the second optical output of the laser source.

24. The laser source of claim 13 wherein:
   (b") the second pump laser source is arranged so as to launch into the fiber-ring optical resonator via the optical coupler a second input portion of the second pump optical signal to propagate in the backward direction;
   (c") the laser source further comprises a second frequency-locking mechanism coupling the second pump laser source and the fiber-ring optical resonator, wherein the second frequency-locking mechanism is arranged so as to control the second pump optical frequency $v_2$ to maintain resonant propagation of the second input portion of the second pump optical signal around the fiber-ring optical resonator in the backward direction; and
   (e") the optical coupler is arranged so as to direct out of the fiber-ring optical resonator an output portion of the second input portion of the second pump optical signal to act as an optical feedback signal to the second frequency-locking mechanism.

25. A method employing the laser source of claim 24, the method comprising:
   (A) launching from the pump laser source into the fiber-ring optical resonator via the optical circulator the first input portion of the pump optical signal, at the pump optical frequency $v_1$, to propagate in the forward direction and thereby produce, from the first input portion of the pump optical signal, the Brillouin laser optical signal, at the Brillouin laser frequency $v_{1S} = v_1 - v_B$, that resonantly propagates around the fiber-ring optical resonator in the backward direction;
   (A') launching from the second pump laser source into the fiber-ring optical resonator via the optical circulator the first input portion of the second pump optical signal, at the second pump optical frequency $v_2$, to propagate in the forward direction and thereby produce, from the first input portion of the second pump optical signal, the second Brillouin laser optical signal, at the second Brillouin laser frequency $v_{2S} = v_2 - v_B$, that resonantly propagates around the fiber-ring optical resonator in the backward direction;
   (B) launching into the fiber-ring optical resonator via the optical coupler the second input portion of the pump optical signal to propagate in the backward direction;
   (B') launching into the fiber-ring optical resonator via the optical coupler the second input portion of the second pump optical signal to propagate in the backward direction;
   (C) using the optical coupler, directing out of the fiber-ring optical resonator the output portion of the second input portion of the pump optical signal to act as the optical feedback signal to the frequency-locking mechanism;
   (C') using the optical coupler, directing out of the fiber-ring optical resonator the output portion of the second input portion of the second pump optical signal to act as the optical feedback signal to the second frequency-locking mechanism;
   (D) using the frequency-locking mechanism, controlling the pump optical frequency $v_1$ to maintain resonant propagation of the second input portion of the pump optical signal around the fiber-ring optical resonator in the backward direction;
   (D') using the frequency-locking mechanism, controlling the second pump optical frequency $v_2$ to maintain resonant propagation of the second input portion of the second pump optical signal around the fiber-ring optical resonator in the backward direction;
   (E) using the optical coupler, directing out of the fiber-ring optical resonator the output portion of the Brillouin laser optical signal to act as the optical output of the laser source; and
   (E') directing out of the fiber-ring optical resonator the output portion of the second Brillouin laser optical signal to act as the second optical output of the laser source.

26. The laser source of claim 13 wherein an output optical difference frequency $|v_{1S} - v_{2S}|$ is less than about 100 GHz, and the laser source further comprises a photodetector arranged so as to receive the output and the second output of the laser source and to generate therefrom an electrical output signal at the output optical difference frequency $|v_{1S} - v_{2S}|$.

27. The laser source of claim 26 further comprising an electrical frequency divider arrange so as to provide a divided electrical output signal at the frequency $|v_{1S}-v_{2S}|/N$, wherein N is an integer.

28. The laser source of claim 26 wherein the laser source is arranged so as to exhibit phase noise of the electrical output signal at the output optical difference frequency $|v_{1S}-v_{2S}|$ less than an operationally acceptable reference phase noise level.

29. The laser source of claim 26 wherein the laser source is arranged so as to exhibit phase noise of the electrical output signal at the output optical difference frequency $|v_{1S}-v_{2S}|$ less than about −90 dBc/Hz at 1 kHz offset frequency and less than about −110 dBc/Hz at 10 kHz offset frequency.

30. The laser source of claim 26 wherein the laser source is arranged so as to exhibit phase noise of the electrical output signal at the output optical difference frequency $|v_{1S}-v_{2S}|$ less than about −110 dBc/Hz at 1 kHz offset frequency and less than about −130 dBc/Hz at 10 kHz offset frequency.

31. A method employing the laser source of claim 26, the method comprising:
    (A) receiving at the photodetector the optical output and the second optical output of the laser source; and
    (B) using the photodiode, generating from the optical output and the second optical output the electrical output signal at the output optical difference frequency $|v_{1S}-v_{2S}|$.

32. The laser source of claim 13 wherein an output optical difference frequency $|v_{1S}-v_{2S}|$ is greater than about 100 GHz, and the laser source further comprises an optical or electro-optical frequency divider that is arranged so as to receive the optical output and the second optical output of the laser source and to generate therefrom a stabilized electrical output signal at an electrical output frequency $f_D$ that is less than the output optical difference frequency $|v_{1S}-v_{2S}|$.

33. The laser source of claim 32 wherein the output optical difference frequency $|v_{1S}-v_{2S}|$ is greater than about 300 GHz.

34. The laser source of claim 32 wherein the frequency $f_D$ is between about 0.3 GHz and about 300 GHz.

35. The laser source of claim 32 wherein the laser source or the optical or electro-optical frequency divider is arranged so as to limit phase noise of the electrical output signal at the frequency $f_D$ to less than an operationally acceptable reference phase noise level.

36. The laser source of claim 32 wherein the laser source or the optical or electro-optical frequency divider is stabilized so as to limit phase noise of the electrical output signal at the frequency $f_D$ to less than about $[-90-20\cdot\log(|v_{1S}-v_{2S}|/f_D)]$ dBc/Hz at 1 kHz offset frequency and less than about $[-110-20\cdot\log(|v_{1S}-v_{2S}|/f_D)]$ dBc/Hz at 10 kHz offset frequency.

37. The laser source of claim 32 wherein the laser source or the optical or electro-optical frequency divider is stabilized so as to limit phase noise of the electrical output signal at the frequency $f_D$ to less than about $[-110-20\cdot\log(|v_{1S}-v_{2S}|/f_D)]$ dBc/Hz at 1 kHz offset frequency and less than about $[-130-20\cdot\log(|v_{1S}-v_{2S}|/f_D)]$ dBc/Hz at 10 kHz offset frequency.

38. A method employing the laser source of claim 32, the method comprising:
    (A) receiving at the optical or electro-optical frequency divider the optical output and the second optical output of the laser source; and
    (B) using the received optical output and the received second optical output, generating with the optical or electro-optical frequency divider the stabilized electrical output signal at the frequency $f_D$.

* * * * *